US007823597B2

(12) United States Patent
Miya

(10) Patent No.: US 7,823,597 B2
(45) Date of Patent: Nov. 2, 2010

(54) SUBSTRATE PROCESSING APPARATUS AND SUBSTRATE PROCESSING METHOD

(75) Inventor: Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 381 days.

(21) Appl. No.: 11/928,694

(22) Filed: Oct. 30, 2007

(65) Prior Publication Data

US 2008/0121252 A1 May 29, 2008

(30) Foreign Application Priority Data

Nov. 28, 2006 (JP) ............................. 2006-320443

(51) Int. Cl.
*H01L 21/304* (2006.01)
*H01L 21/00* (2006.01)

(52) U.S. Cl. ...................................... 134/105
(58) Field of Classification Search .................. 134/105
See application file for complete search history.

(56) References Cited

U.S. PATENT DOCUMENTS

| 4,817,652 | A |   | 4/1989  | Liu et al.     |         |
|-----------|---|---|---------|----------------|---------|
| 4,962,776 | A |   | 10/1990 | Liu et al.     |         |
| 5,857,474 | A | * | 1/1999  | Sakai et al.   | 134/102.3 |
| 6,783,599 | B2|   | 8/2004  | Gale et al.    |         |
| 7,410,545 | B2| * | 8/2008  | Matsubara      | 134/33  |
| 2004/0261817 | A1| * | 12/2004 | Araki et al. | 134/2 |
| 2008/0121251 | A1| * | 5/2008 | Miya et al.   | 134/4 |

FOREIGN PATENT DOCUMENTS

| EP | 0 423 761      |   | 4/1991  |
|----|----------------|---|---------|
| EP | 0423761 A2     | * | 4/1991  |
| JP | 62-169420      |   | 7/1987  |
| JP | 3-145130       |   | 6/1991  |
| JP | 3-503975       |   | 9/1991  |
| JP | 3-261142       |   | 11/1991 |
| JP | 11274046       | * | 3/1998  |
| JP | 11-31673       |   | 2/1999  |
| JP | 11031673       | * | 2/1999  |
| JP | 3343013        |   | 8/2002  |

* cited by examiner

*Primary Examiner*—Michael Barr
*Assistant Examiner*—Jason P Riggleman
(74) *Attorney, Agent, or Firm*—Ostrolenk Faber LLP

(57) ABSTRACT

DIW is supplied toward a surface of a substrate to form a lower layer liquid film, which is then frozen to form a lower layer frozen film. Further, DIW cooled down to a temperature at which the lower layer frozen film will not melt is supplied toward a surface of the lower layer frozen film to form an upper layer liquid film, which is then frozen to form an upper layer frozen film in a layered structure. DIW which is at room temperature is thereafter supplied, thereby melting the entirety of the lower layer frozen film and the upper layer frozen film to remove these films together with particles off from the surface of the substrate.

9 Claims, 17 Drawing Sheets

LOWER LAYER LIQUID FILM FORMATION

LOWER LAYER LIQUID FILM FREEZING

UPPER LAYER LIQUID FILM FORMATION

UPPER LAYER LIQUID FILM FREEZING

FROZEN FILM REMOVAL

LOWER LAYER LIQUID FILM FORMATION

LOWER LAYER LIQUID FILM FREEZING

UPPER LAYER LIQUID FILM FORMATION/FREEZING

FROZEN FILM REMOVAL

F I G. 1 5
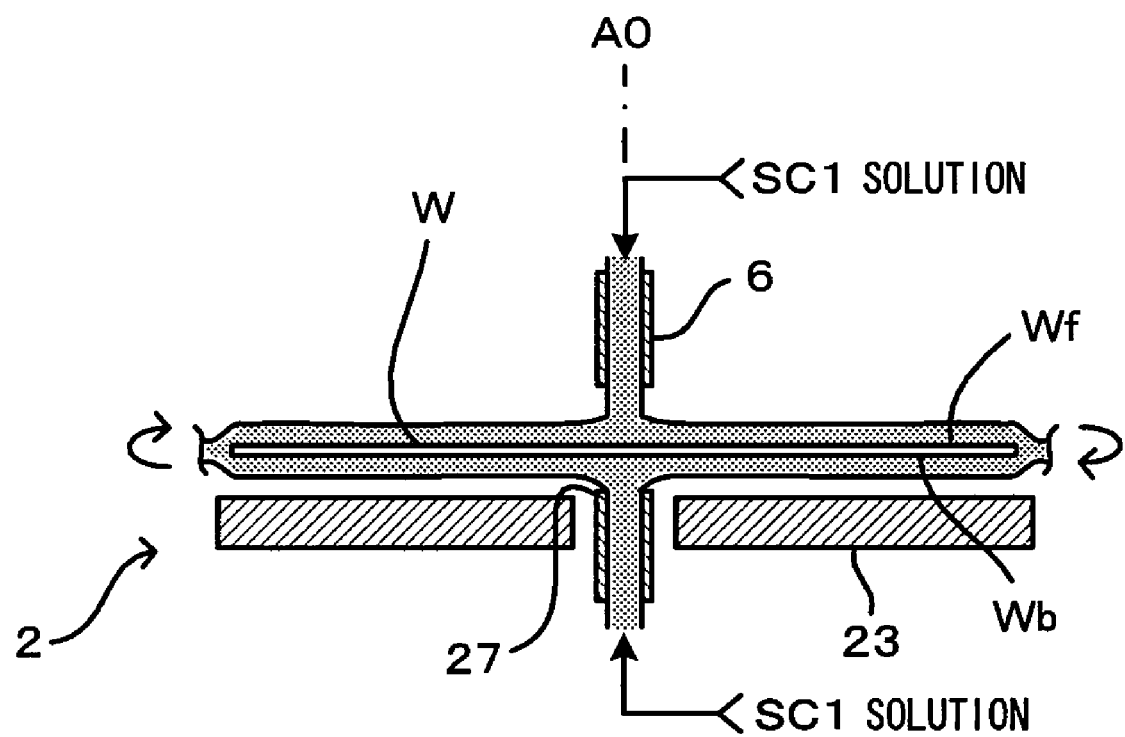

SUBSTRATE PROCESSING APPARATUS AND SUBSTRATE PROCESSING METHOD

CROSS REFERENCE TO RELATED APPLICATION

The disclosure of Japanese Patent Application No. 2006-320443 filed Nov. 28, 2006 including specification, drawings and claims is incorporated herein by reference in its entirety.

BACKGROUND OF THE INVENTION

1. Field of the Invention

The present invention relates to a substrate processing apparatus and a substrate processing method which freeze a liquid film formed on a surface of a substrate and removes the frozen film, the substrate including various types such as semiconductor wafers, glass substrates for photomask, glass substrates for liquid crystal display, glass substrates for plasma display, substrates for FED (field emission display), substrates for optical disks, substrates for magnetic disks, and substrates for magnet-optical disks (hereinafter called simply a "substrate").

2. Description of the Related Art

Conventionally used is a technique of freezing a liquid film as it is maintained adhering to a substrate surface by cooling a substrate as one of a substrate processing. Particularly this freezing technique is used as part of a substrate cleaning processing. That is, as devices typified by semiconductors have finer patterns, more advanced functions and higher precision, it becomes increasingly difficult to remove fine contaminants such as particles adhering to the substrate surface without destroying patterns formed on the substrate surface. And so, particles adhering to the substrate surface are removed in the following manner utilizing the freezing technique described above.

First, a liquid film is formed on a substrate surface by supplying liquid to the substrate surface. Subsequently, the liquid film is frozen by cooling the substrate. Thus, a frozen film is formed on the substrate surface to which particles adhere. Finally, the frozen film is removed from the substrate surface, whereby the particles are removed from the substrate surface together with the frozen film.

In the apparatus described in JP-A-3-145130 for instance, with a substrate housed inside a processing chamber, a removal fluid such as steam or ultra-pure vapor is supplied to the substrate surface, whereby a liquid film of the removal fluid is formed on the substrate surface. Following this, cooling gas which is cooler than the freezing temperature of the removal fluid is injected into and circulated inside the processing chamber so that the liquid film on the substrate surface is frozen and a frozen film is produced on the entire substrate surface. The frozen film is then thawed to remove particles adhering to the substrate surface. Specifically, in the apparatus described in JP-A-3-145130, the pressure which develops at the time of volume expansion upon freezing of the liquid film and which works upon the particles reduces adhesion force between the particles and the substrate, whereby the particles are removed off from the surface of the substrate.

SUMMARY OF THE INVENTION

By the way, an attempt to increase the pressure which develops due to volume expansion upon freezing of the liquid film and accordingly facilitate removal of the particles, the pressure may become excessively large and lead to destruction of patterns or otherwise damage the substrate. Hence, for favorable substrate processing, it is necessary to consider both encouraged removal of the particles and prevention of damage upon the substrate. However, the apparatus described in JP-A-3-145130 does not provide sufficient consideration on these.

The present invention has been made in light of the problems above, and accordingly aims at providing a substrate processing apparatus and a substrate processing method with which it is possible to facilitate particle removal while preventing damage upon a substrate.

According to a first aspect of the present invention, there is provided a substrate processing apparatus, comprising: a liquid supplier which supplies a liquid toward a surface of a substrate; and a freezing unit which freezes a liquid film which is formed on the substrate surface by the supply of the liquid performed by the liquid supplier, wherein a supply of the liquid toward a surface of a lower layer frozen film which is formed by the freezing of the liquid film performed by the freezing unit and freezing of thus supplied liquid are executed at least once to thereby form an upper layer frozen film on top of the lower layer frozen film in a layered structure, and then the entire frozen films formed on the substrate surface are removed.

According to a second aspect of the present invention, there is provided a substrate processing method, comprising: a multiply-layered frozen film forming step of repeating more than once a liquid supplying and freezing step of supplying a liquid toward a substrate surface and freezing thus supplied liquid, to thereby form a frozen film with plural layers in a layered structure on the substrate surface; and a removal step of removing the entire frozen film with plural layers.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 15 is a diagram showing a frozen film removal processing in the apparatus shown in FIG. 14.

DETAILED DESCRIPTION OF THE PREFERRED EMBODIMENTS

First Embodiment

Figure 1:
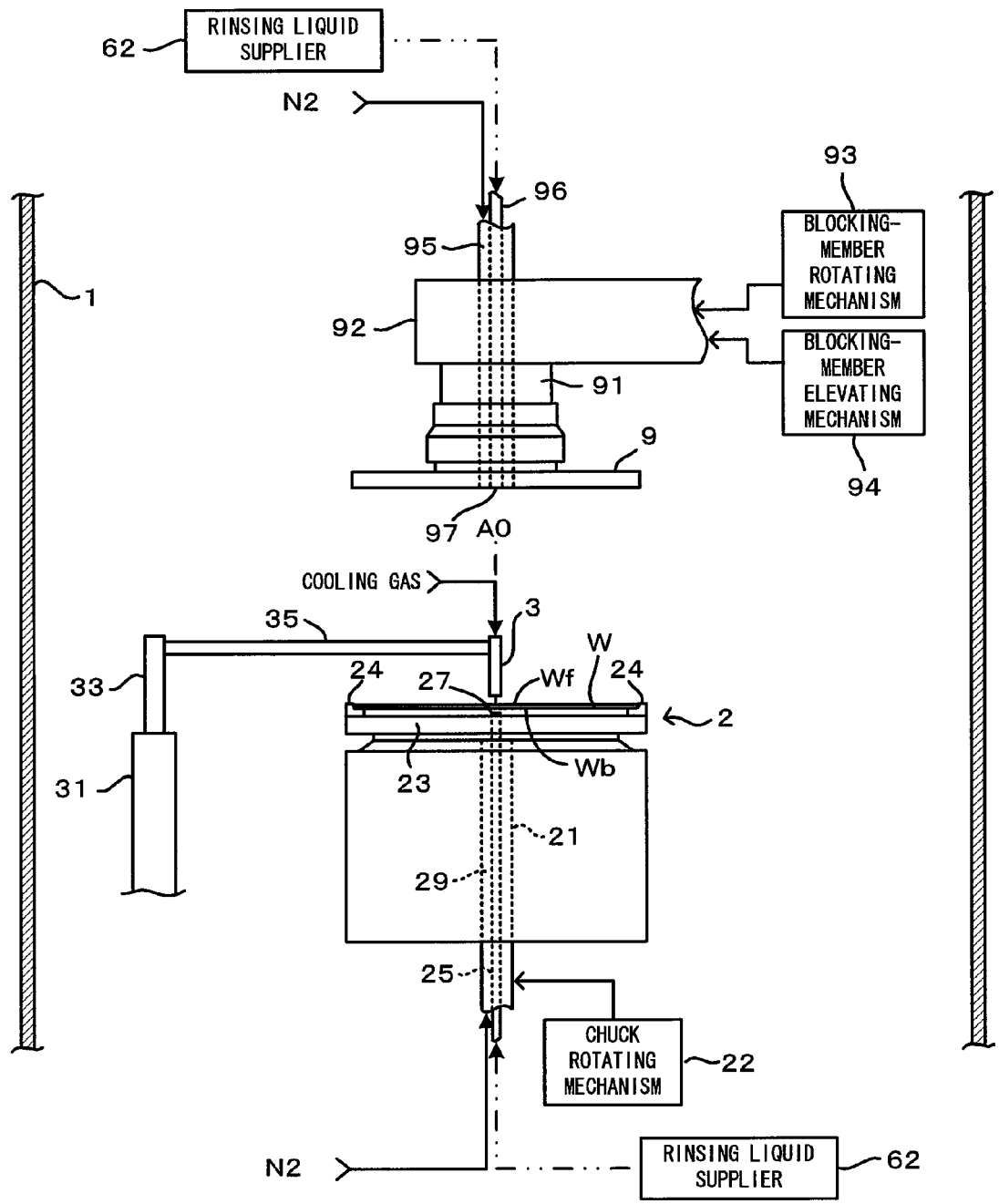
FIG. 1 is a diagram showing a substrate processing apparatus of a first embodiment of the invention.
Figure 2:
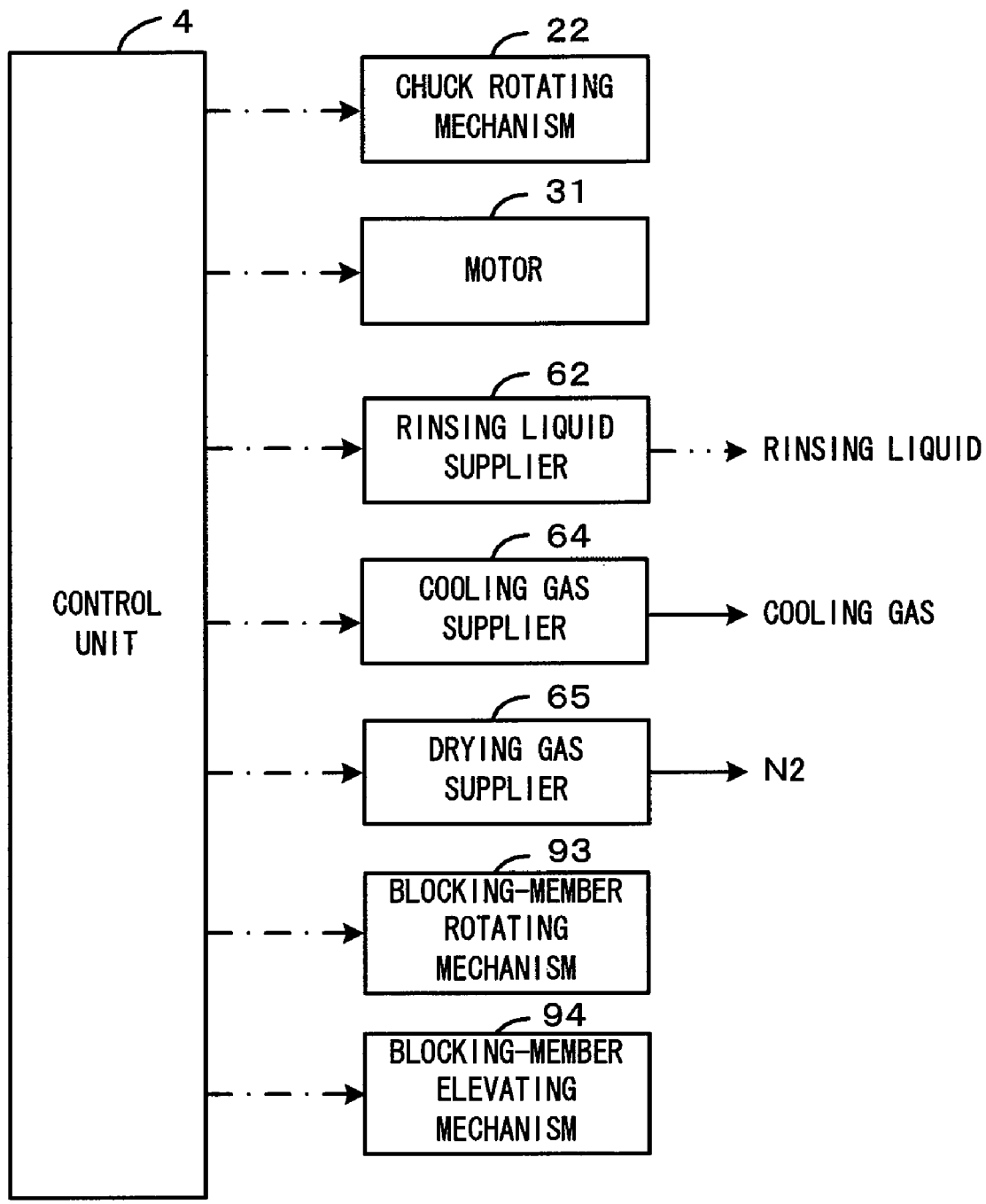
FIG. 2 is a block diagram showing a control construction of the substrate processing apparatus shown in FIG. 1.

FIG. 1 is a diagram showing a substrate processing apparatus of a first embodiment of the invention. FIG. 2 is a block diagram showing a control construction of the substrate processing apparatus shown in FIG. 1. This substrate processing apparatus is a single wafer type substrate processing apparatus that is used for the cleaning processes for the purpose of removing contaminants such as particles adhering to a top surface Wf and a rear surface Wb of a substrate W such as semiconductor wafer. More specifically, this substrate processing apparatus is an apparatus which forms a liquid film on the top surface Wf of the substrate W, forms a lower layer frozen film by freezing the liquid film, then forms an upper layer frozen film on the top surface of the lower layer frozen film in a layered structure, and then, removes whole of the frozen film from the top surface Wf of the substrate W, whereby a cleaning processing is performed to the substrate W.

This substrate processing apparatus includes a processing chamber 1 which has a processing space inside in which a cleaning processing is performed to the substrate W, and a control unit 4 which controls the entire apparatus. In the processing chamber 1, a spin chuck 2, a cooling gas discharge nozzle 3, and a blocking member 9 are provided. The spin chuck 2 holds the substrate W in an approximately horizontally such that the top surface Wf of the substrate W is directed toward above and rotates the substrate W. The cooling gas discharge nozzle 3 discharges cooling gas for freezing a liquid film toward the top surface Wf of the substrate W held by the spin chuck 2. The blocking member 9 is disposed facing the top surface Wf of the substrate W held by the spin chuck 2.

A disk-shaped spin base 23 is fixed by a fastening component such as a screw to a top end portion of a central shaft 21 of the spin chuck 2. The central shaft 21 is linked to a rotation shaft of a chuck rotating mechanism 22 which contains a motor. The spin base 23 fixed to the central shaft 21 rotates about a rotation center A0 when the chuck rotating mechanism 22 is driven in response to an operation command received from the control unit 4.

Plural chuck pins 24 for holding the substrate W at the rim thereof are disposed upright in the vicinity of the rim of the spin base 23. There may be three or more chuck pins 24 to securely hold the disk-shaped substrate W, and the chuck pins 24 are arranged at equal angular intervals along the rim of the spin base 23. Each of the respective chuck pins 24 comprises a substrate support part which supports the substrate W at the rim thereof from below and a substrate holding part which presses the substrate W at the outer peripheral edge surface thereof to hold the substrate W. Each chuck pin 24 is structured so as to be capable of switching between a pressing state that the substrate holding part presses the substrate W at the outer peripheral edge surface thereof and a released state that the substrate holding part stays away from the outer peripheral edge surface of the substrate W.

The respective chuck pins 24 are in the released state while the substrate W is being transferred to the spin base 23 but in the pressing state for cleaning of the substrate W. When in the pressing state, the respective chuck pins 24 hold the substrate W at the rim thereof and keep the substrate approximately horizontally at a predetermined distance from the spin base 23. The substrate W is held with its top surface Wf directed toward above and its rear surface Wb toward below. Meanwhile, in this embodiment, fine patterns are formed on the top surface Wf of the substrate W, which means that the top surface Wf is a pattern-formed surface.

The blocking member 9 is in a form of a disk-shape which has an opening at its center. The under surface of the blocking member 9 is a substrate-facing surface which faces the top surface Wf of the substrate W approximately parallel, and the size of this surface is equal to or greater than the diameter of the substrate W. The blocking member 9 is attached approximately horizontally to the lower end of a support shaft 91 which is shaped approximately like a circular cylinder. An arm 92 extending in the horizontal direction holds the support shaft 91 so that the support shaft 91 can rotate about a vertical axis which penetrates the center of the substrate W. Further, a blocking-member rotating mechanism 93 and a blocking-member elevating mechanism 94 are connected to the arm 92.

The blocking-member rotating mechanism 93 rotates the support shaft 91 in response to an operation command from the control unit 4 about the vertical axis which penetrates the center of the substrate W. Further, the control unit 4 controls an operation of the blocking-member rotating mechanism 93 to rotate the blocking member 9 at about the same rotation speed in the same direction as the substrate W in accordance with rotation of the substrate W which is held by the spin chuck 2.

The blocking-member elevating mechanism 94 moves the blocking member 9 toward the spin base 23, and conversely, away therefrom in accordance with an operation command from the control unit 4. Specifically, the control unit 4 controls an operation of the blocking-member elevating mechanism 94 to move the blocking member 9 upward to a separated position (position shown in FIG. 1) above the spin chuck 2 upon loading and unloading the substrate W into and from the substrate processing apparatus, whereas to move the blocking member 9 downward to a specified facing position set very close to the top surface Wf of the substrate W held by the spin chuck 2 upon performing a predetermined processing to the substrate W.

The support shaft 91 is formed hollow and accepts penetration by a gas supply pipe 95 which extends to the opening of the blocking member 9. The gas supply pipe 95 is connected with the drying gas supplier 65. The drying gas supplier 65 supplies nitrogen gas via the gas supply pipe 95 to a space which is formed between the blocking member 9 and the top surface Wf of the substrate W, during drying of the substrate W after cleaning. Although nitrogen gas is supplied from the drying gas supplier 65 as a drying gas in this embodiment, air or another inert gas may be supplied.

A rinsing liquid supply pipe 96 is inserted inside the gas supply pipe 95. A bottom end portion of the rinsing liquid supply pipe 96 extends to the opening of the blocking member 9, and a rinsing liquid discharging nozzle 97 is disposed at a tip end of the rinsing liquid supply pipe 96. Whereas, a top end portion of the rinsing liquid supply pipe 96 is connected with a rinsing liquid supplier 62. The rinsing liquid supplier 62 supplies a rinsing liquid. As the rinsing liquid, deionized water (hereinafter called "DIW") is used for instance in this embodiment.

Figure 3:
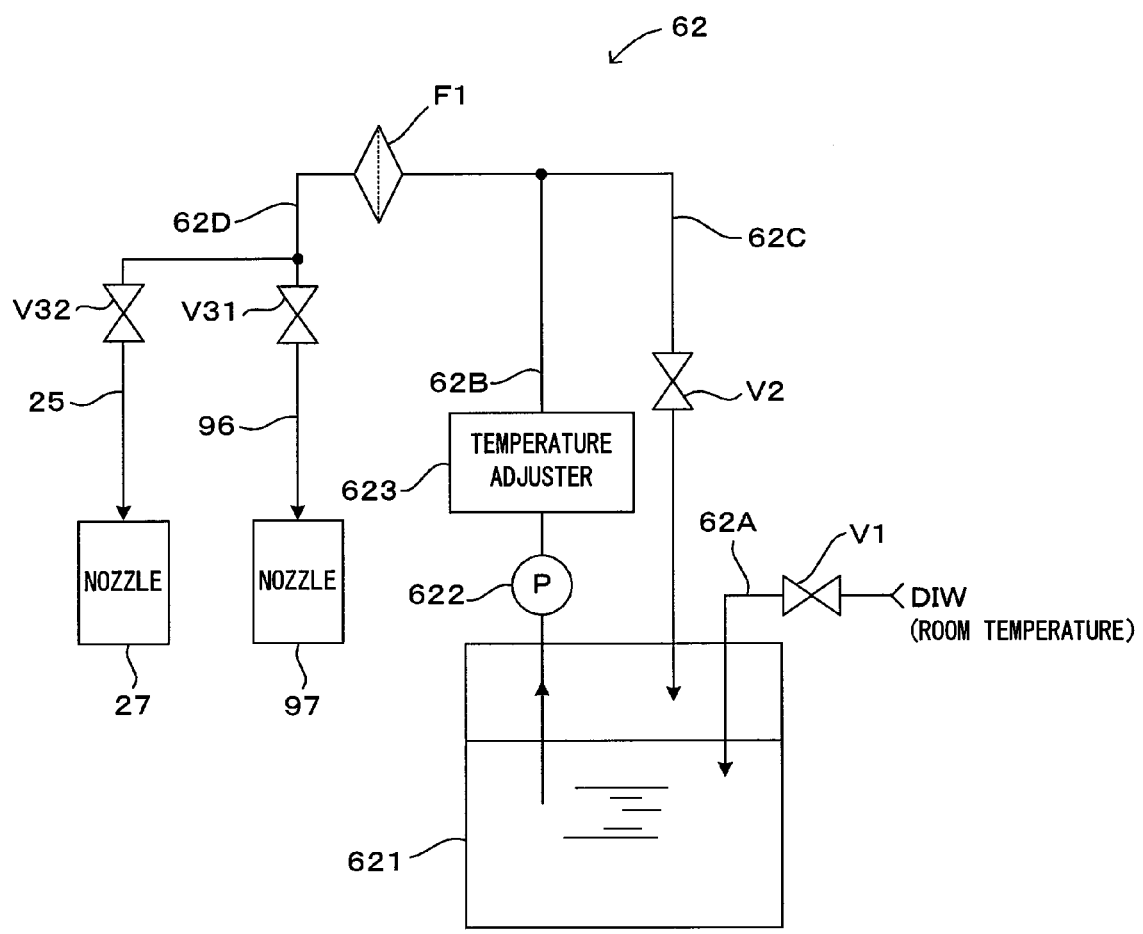
FIG. 3 is a schematic diagram showing a structure of the rinsing liquid supplier.

FIG. 3 is a schematic diagram showing a structure of the rinsing liquid supplier. A tank 621 stores DIW and is connected with a DIW supply source (not shown) already installed in a plant for instance via a supply pipe 62A in which a valve V1 is disposed. A supply pipe 62B is for supplying DIW to outside from the tank 621, and a pump 622 and a temperature adjuster 623 are disposed in the supply pipe 62B. The lower end of the supply pipe 62B is disposed reaching DIW stored in the tank 621, while the upper end of the supply pipe 62B branches into supply pipes 62C and 62D. A valve V2 is disposed in the supply pipe 62C, and the lower end of the supply pipe 62C is disposed sticking into inside the tank 621. Meanwhile, a filter F1 is disposed in the supply pipe 62D. The top end of the supply pipe 62D branches out into the rinsing liquid supply pipe 96 described above in which a valve V31 is disposed and a liquid supply pipe 25 described later in which a valve V32 is disposed. Hence, it is possible to feed DIW into the rinsing liquid supply pipe 96 and the liquid supply pipe 25 individually from each other or simultaneously. The temperature adjuster 623 cools down DIW in response to an operation command received from the control unit 4. The temperature adjuster 623 cools down the DIW to a temperature at which a frozen film does not melt when the DIW is supplied to the surface of the frozen film, the temperature being not more than 5 degrees centigrade for instance in this embodiment. Cooling down to an even lower temperature of 2 degrees centigrade or below is preferable for more secure prevention of melting of the frozen film. The temperature adjuster 623 maintains DIW at 0 degrees centigrade or a higher temperature, which prevents DIW from freezing.

In a structure like this, DIW at room temperature is supplied to the tank 621 from the DIW supply source when the valve V1 is opened from the state that the valves V1, V2, V31 and V32 are closed. Meanwhile, when the valve V2 is opened with the valves V31 and V32 closed and the pump 622 and the temperature adjuster 623 operate, the temperature adjuster 623 cools down DIW while the DIW circulates through the tank 621 and the supply pipes 62B and 62C. When the valve V2 is closed and the valve V31 is opened, thus cooled DIW is supplied toward the rinsing liquid supply pipe 96 after filtered by the filter F1. The cooled DIW supplied to the rinsing liquid supply pipe 96 is discharged toward the top surface Wf of the substrate W from the rinsing liquid discharging nozzle 97, whereby a lower layer liquid film 11f and an upper layer liquid film 12f (FIGS. 5A and 5C) are formed. When the valve V2 is closed and the valve V32 is opened with the temperature adjuster 623 not operating and the pump 622 alone working, DIW at room temperature is supplied toward the liquid supply pipe 25 after filtered by the filter F1, and discharged toward the rear surface Wb of the substrate W from a liquid discharging nozzle 27. In this embodiment, the rinsing liquid supplier 62, the rinsing liquid supply pipe 96 and the rinsing liquid discharging nozzle 97 thus correspond to the "liquid supplier" of the invention.

Description is to be continued by referring back to FIG. 1. The central shaft 21 of the spin chuck 2 is formed by a hollow shaft having a cylindrical cavity. A cylindrical liquid supply pipe 25 for supplying a liquid to the rear surface Wb of the substrate W is inserted in the central shaft 21. The liquid supply pipe 25 extends to a position close to the rear surface Wb which is in the under surface side of the substrate W which is held by the spin chuck 2, and a tip end of the liquid supply pipe 25 mounts a liquid discharging nozzle 27 which discharges the liquid toward a central area in the bottom surface of the substrate W. The liquid supply pipe 25 is connected to the rinsing liquid supplier 62. When DIW is supplied from the rinsing liquid supplier 62, the DIW is discharged from the liquid discharging nozzle 27 via the liquid supply pipe 25 toward the rear surface Wb of the substrate W and the rear surface Wb is rinsed.

A clearance between the inner wall surface of the central shaft 21 and the outer wall surface of the liquid supply pipe 25 forms a gas supply passage 29 which is in a form of a ring in horizontal section. This gas supply passage 29 is connected to the drying gas supplier 65, so that nitrogen gas is supplied from the drying gas supplier 65 via the gas supply passage 29 to a space formed between the spin base 23 and the rear surface Wb of the substrate W.

A motor 31 is disposed at a place outward from the spin chuck 2 in a circumferential direction. A rotary shaft 33 is connected to the motor 31, an arm 35 extending horizontally is connected to the rotary shaft 33, and the cooling gas discharge nozzle 3 is attached to the end of the arm 35. When the motor 31 is driven in accordance with an operation command from the control unit 4, the arm 35 swings around the rotary shaft 33.

Figure 4A:
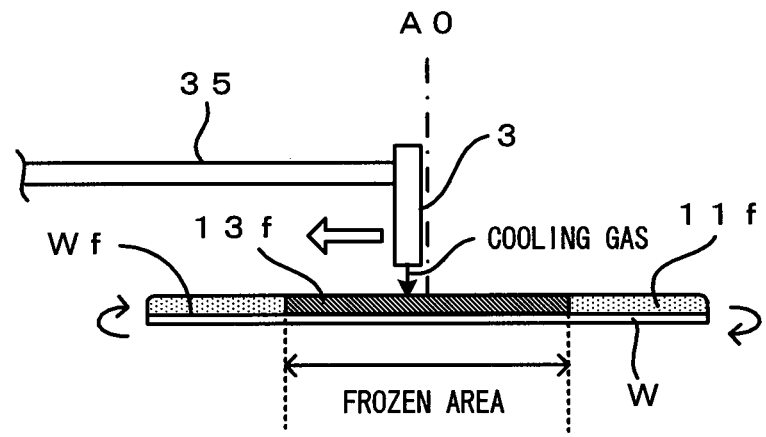
FIGS. 4A and 4B are diagrams showing a movement of the cooling gas discharge nozzle.
Figure 4B:
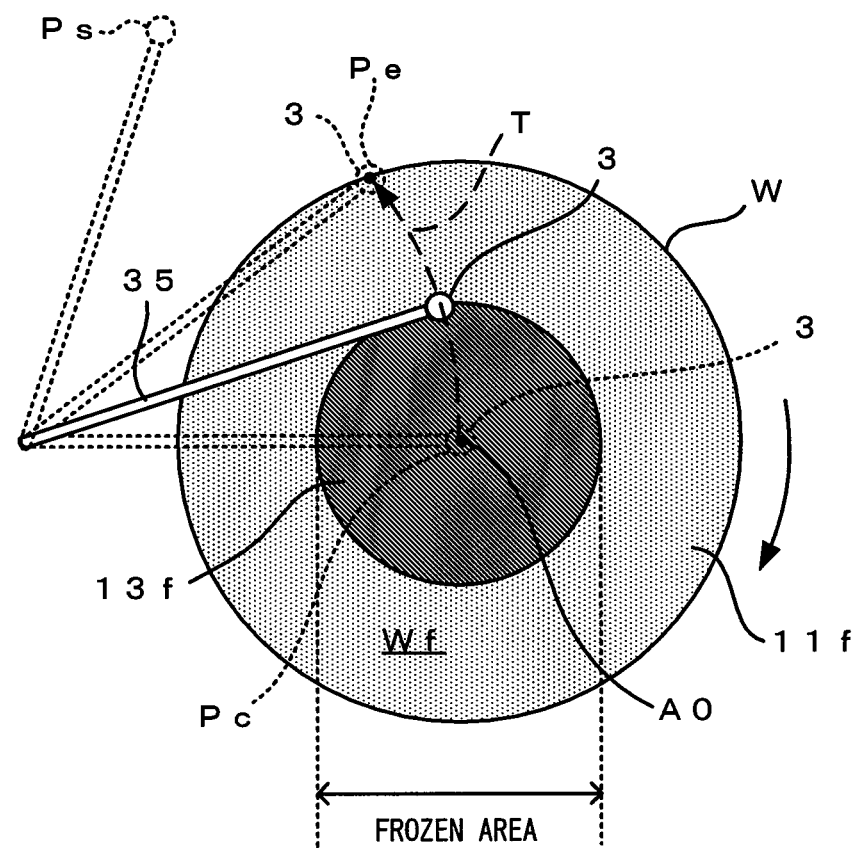

FIGS. 4A and 4B are diagrams showing a movement of the cooling gas discharge nozzle. FIG. 4A is a side view of the cooling gas discharge nozzle and FIG. 4B is a plan view thereof. When the motor 31 is driven to swing the arm 35 based on the operation command from the control unit 4, the cooling gas discharge nozzle 3 moves along a moving trajectory T while facing the top surface Wf of the substrate W as shown in FIG. 4B. The moving trajectory T is a trajectory from a rotational center position Pc toward an edge position Pe. At this stage, the rotational center position Pc is located over the substrate W and above the rotation center A0 of the substrate W, and the edge position Pe is located above the outer circumferential edge of the substrate W. That is, the motor 31 relatively moves the cooling gas discharge nozzle 3 relative to the substrate W and parallel to the top surface Wf of the substrate W. Further, the cooling gas discharge nozzle 3 is movable to a standby position Ps which is located on an extended line of the moving trajectory T and away from the opposed position to the substrate W.

The cooling gas discharge nozzle 3 is connected to a cooling gas supplier 64. The cooling gas supplier 64 supplies cooling gas to the cooling gas discharge nozzle 3 in accordance with an operation command from the control unit 4. When the cooling gas discharge nozzle 3 is positioned facing the top surface Wf of the substrate W, and the cooling gas is supplied to the cooling gas discharge nozzle 3 from the cooling gas supplier 64, the cooling gas is discharged from the cooling gas discharge nozzle 3 toward the top surface Wf of the substrate W locally. And, when the motor 31 moves the cooling gas discharge nozzle 3 along the moving trajectory T while the substrate W is rotated by the spin chuck 2 in accordance with a operation command from the control unit 4, in a state that the cooling gas is discharged from the cooling gas discharge nozzle 3, the cooling gas is supplied to the entire top surface Wf of the substrate W. Therefore, the entire liquid film 11f formed on the top surface Wf of the substrate W by the discharge of DIW from the rinsing liquid discharge nozzle 97 is frozen to form a frozen film 13f on the entire top surface Wf of the substrate W.

The height of the cooling gas discharge nozzle 3 from the top surface Wf of the substrate W is different depending upon the supplying amount of the cooling gas, but may be set not more than 50 mm for instance and preferably about several mm. Such height of the cooling gas discharge nozzle 3 from the top surface Wf of the substrate W and the supplying amount of the cooling gas is determined experimentally from (1) a viewpoint of giving cold energy the cooling gas has to the liquid film 11*f* efficiently, and (2) a viewpoint of freezing the liquid film 11*f* stably without distorting the surface of the liquid film 11*f* by the cooling gas.

A temperature of the cooling gas is below the freezing point of the liquid which composes the liquid film 11*f* formed on the top surface Wf of the substrate W, that is, below the freezing point of DIW in this embodiment. The cooling gas is produced by flowing nitrogen gas in a pipe which is disposed in a liquid nitrogen stored in a tank, for example, and is cooled at −100 degrees centigrade for instance. Meanwhile, oxygen gas, clean air, and the like may be used instead of nitrogen gas. Since such cooling gas is used, it is easy to eliminate contaminants contained in the cooling gas by a filter and the like before supplying the gas to the top surface Wf of the substrate W, which makes it possible to prevent from contaminating the top surface Wf of the substrate W in freezing the liquid film 11*f*. Thus, in this embodiment, the cooling gas discharge nozzle 3 corresponds to the "cooling gas discharger" of the invention, and the motor 31 corresponds to the "relative moving mechanism" of the invention.

Figure 5A:
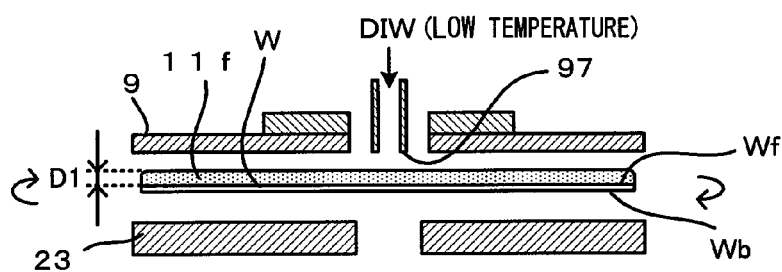
FIGS. 5A through 5E are diagrams showing a processing to the top surface Wf of the substrate W.
Figure 5B:
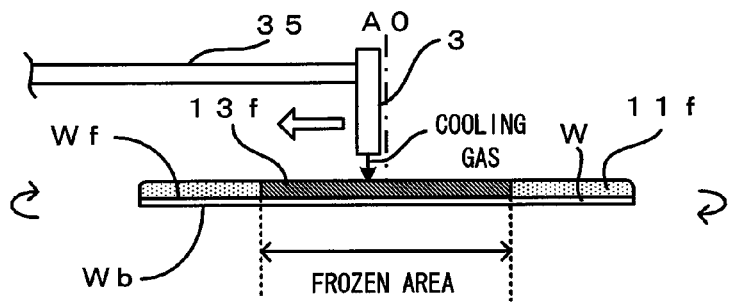
Figure 5C:
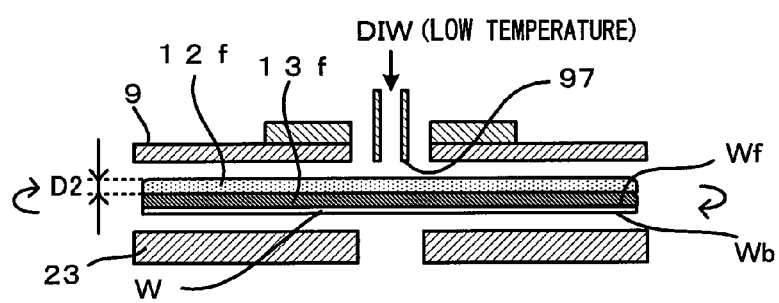
Figure 5D:
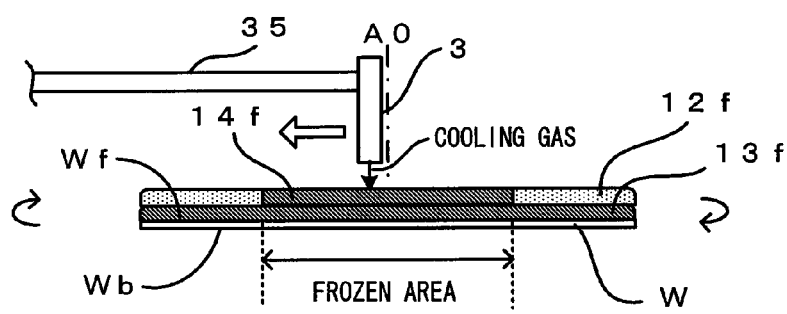
Figure 5E:
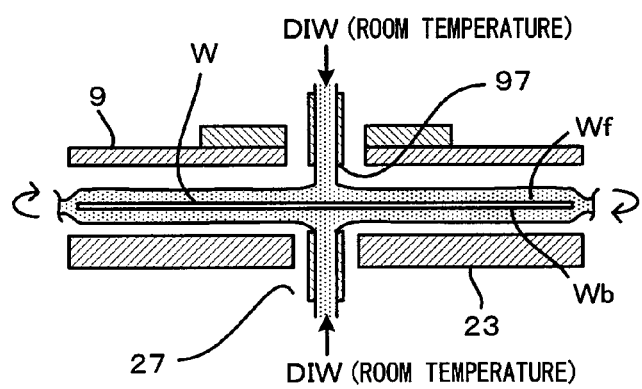
Figure 6:
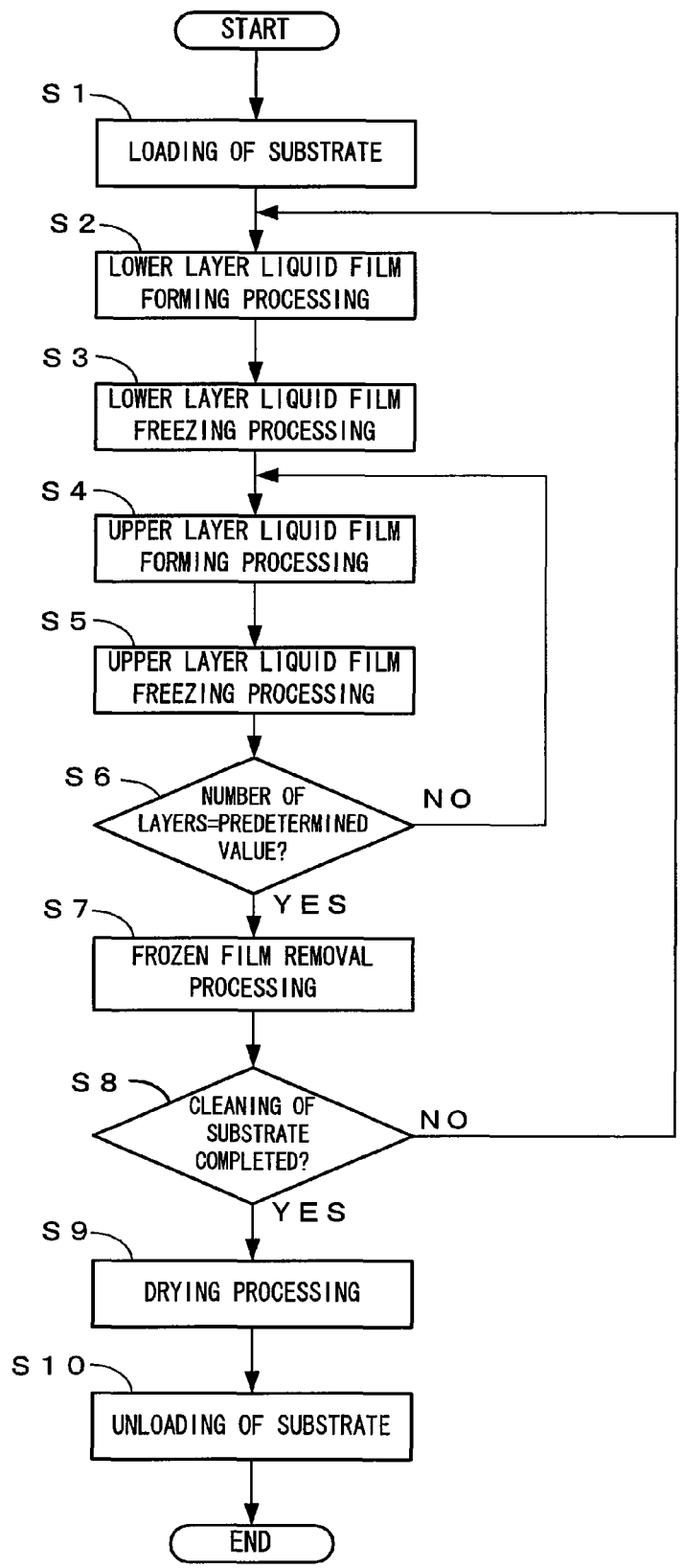
FIG. 6 is a flow chart of the operation in the substrate processing apparatus shown in FIG. 1.

The cleaning operation in the substrate processing apparatus having the structure above will now be described with reference to FIGS. 5A through 5E and 6. FIGS. 5A through 5E are diagrams showing a processing to the top surface Wf of the substrate W. FIG. 5A shows a lower layer liquid film forming processing, FIG. 5B shows a lower layer liquid film freezing processing, FIG. 5C shows an upper layer liquid film forming processing, FIG. 5D shows an upper layer liquid film freezing processing, and FIG. 5E shows a frozen film removal processing. Further, FIG. 6 is a flow chart of the operation in the substrate processing apparatus shown in FIG. 1. In this apparatus, upon loading of the substrate W into inside the apparatus, the control unit 4 controls the respective sections of the apparatus and cleaning processing is performed upon the substrate W. First, the substrate W is loaded into inside the processing chamber 1 with the top surface Wf of the substrate W directed toward above, and held by the spin chuck 2 (Step S1). Meanwhile, the blocking member 9 is located at the separated position, which obviates interference with the substrate W.

As the spin chuck 2 holds an unprocessed substrate W, the blocking member 9 descends to the opposed position and becomes positioned close to the top surface Wf of the substrate W. The top surface Wf of the substrate W is therefore covered as it is located in the vicinity of the substrate-facing surface of the blocking member 9, and is blocked from the surrounding atmosphere around the substrate W. The control unit 4 then activates the chuck rotating mechanism 22 to rotate the spin chuck 2, and activates the rinsing liquid supplier 62 to discharge cooled DIW from the rinsing liquid discharging nozzle 97 to supply the DIW to the top surface Wf of the substrate W. Centrifugal force which develops as the substrate W rotates acts upon the DIW supplied to the top surface Wf of the substrate W, and the DIW spreads uniformly outward in the radial direction of the substrate W and is partially shaken off from the substrate. This controls the thickness of the liquid film uniform all across the entire top surface Wf of the substrate W, and forms the lower layer liquid film 11*f* which has a predetermined thickness D1 all over the top surface Wf of the substrate W as shown in FIG. 5A (Step S2). At this stage, the control unit 4 adjusts the number of rotation of the spin chuck 2, whereby the lower layer liquid film 11*f* which has a predetermined thickness D1 is formed. The thickness of the lower layer liquid film 11*f* will be described in detail hereinafter.

When the lower layer liquid film forming processing is thus finished, the control unit 4 positions the blocking member 9 at the separated position and moves the cooling gas discharge nozzle 3 to the rotational center position Pc from the stand-by position Ps. While discharging the cooling gas toward the top surface Wf of the rotating substrate W, the cooling gas discharge nozzle 3 then moves gradually toward the edge position Pe of the substrate W. As a result, as shown in FIG. 5B, of the surface region of the top surface Wf of the substrate W, an area where the liquid film 11*f* has been frozen expands toward the periphery edge from the center of the top surface Wf of the substrate W, whereby the lower layer frozen film 13*f* is formed all over the top surface Wf of the substrate W (Step S3). At this stage, since the DIW which composes the lower layer liquid film 11*f* is cooled to a low temperature by the temperature adjuster 623, it is possible to form the lower layer frozen film 13*f* in a short time.

Meanwhile, it is possible to suppress an uneven distribution of the liquid film thickness and accordingly form the lower layer frozen film 13*f* all over the top surface Wf of the substrate W by rotating the substrate W while the cooling gas discharge nozzle 3 is moved. However, if the substrate W rotates at an excessively high speed, airflows developed by the rotations of the substrate W may diffuse the cooling gas which is discharged from the cooling gas discharge nozzle 3 and the efficiency of freezing the liquid film may worsen. Therefore, the rotation speed of the substrate W in performing the lower layer liquid film freezing processing and the upper layer liquid film freezing processing which is described hereinafter is set to 1 through 300 rpm for example in this embodiment. Further, it is more preferable that the rotation speed of the substrate W is determined considering the traveling speed of the cooling gas discharge nozzle 3, the temperature and the flow rate of the discharged gas and the thickness of the liquid film as well.

When the freezing of the liquid film is completed, the control unit 4 moves the cooling gas discharge nozzle 3 to the stand-by position Ps and positions the blocking member 9 at the opposed position. Then, the control unit 4, similarly to Step S2, activates the chuck rotating mechanism 22 to rotate the spin chuck 2, and activates the rinsing liquid supplier 62 to discharge cooled DIW from the rinsing liquid discharging nozzle 97 to supply the DIW to the top surface Wf of the substrate W. Hence, the thickness of the liquid film is made uniform all across the entire top surface Wf of the substrate W, and the upper layer liquid film 12*f* which has a predetermined thickness D2 is formed on the lower layer frozen film 13*f* in a layered structure all over the top surface Wf of the substrate W as shown in FIG. 5C (Step S4). At this stage, since the DIW is cooled by the temperature adjuster 623, the lower layer frozen film 13*f* does not melt.

After the upper layer liquid film forming processing is finished, the control unit 4, similarly to Step S3, positions the blocking member 9 at the separated position and moves the cooling gas discharge nozzle 3 to the rotational center position Pc from the stand-by position Ps. While discharging the cooling gas toward the top surface Wf of the rotating substrate W, the cooling gas discharge nozzle 3 then moves gradually toward the edge position Pe of the substrate W. As a result, as shown in FIG. 5D, of the surface region of the top surface Wf of the substrate W, an area where the upper liquid film 12*f* has been frozen expands toward the periphery edge from the center of the top surface Wf of the substrate W, whereby the upper layer frozen film 14*f* is formed all over the top surface Wf of the substrate W (Step S5). At this stage, since the DIW which composes the upper layer liquid film 12*f* is cooled by the temperature adjuster 623 at such a temperature that the lower layer frozen film 13*f* is not melted, it is possible to form the upper layer frozen film 14*f* in a short time.

Subsequently, the determination is made whether the number of layer of the upper layer frozen film is equal to a predetermined value or not (Step S6). When the number of layer is not equal to the predetermined value (NO at Step S6), Steps S4 and S5 are executed repeatedly, whereas the number of layer is equal to the predetermined value (YES at Step S6), the operation proceeds to Step 7. In this embodiment, the predetermined value is 1 as shown in FIGS. 5A through 5E.

At Step S7, the control unit 4 moves the cooling gas discharge nozzle 3 to the stand-by position Ps and positions the blocking member 9 at the opposed position. The rinsing liquid discharging nozzle 97 supplies the DIW to the top surface Wf of the substrate W before the lower layer frozen film 13*f* and the upper layer frozen film 14*f* have been melted. At this time, the control unit 4 stops the operation of the temperature adjuster 623, whereby the DIW at room temperature is supplied to the substrate W. This causes whole of the frozen films 13*f* and 14*f* on the top surface Wf of the substrate W to be melted as shown in FIG. 5E. Further, the centrifugal force which develops as the substrate W rotates acts upon the frozen films 13*f* and 14*f*, and upon the DIW supplied to the top surface Wf of the substrate W. In consequence, the frozen films 13*f* and 14*f* containing the particles are removed from the top surface Wf of the substrate W and are discharged to outside the substrate.

Meanwhile, at the frozen film removal processing, it is preferable that the blocking member 9 rotates as the substrate W rotates. The liquid component adhering to the blocking member 9 is therefore shaken off, and it is possible to prevent the mist-like liquid from intruding into the space formed between the blocking member 9 and the top surface Wf of the substrate W from around the substrate.

When the frozen film removal processing is thus finished, the determination is made whether the cleaning processing of the substrate W is completed or not (Step S8). When it is determined that the processing is completed (YES at Step S8), drying processing of the substrate W is carried out (Step S9). On the other hand, when it is determined that the processing is not completed (NO at Step S8), the routine is returned to Step S2 and DIW is supplied to form the lower layer liquid film, and Steps S2 through S7 are executed repeatedly hereinafter. To be more specific, depending on the surface condition of the top surface Wf of the substrate W which is a surface-to-be-processed or the particle diameters and the type of particles which must be removed, the particles may not be removed sufficiently off from the top surface Wf of the substrate W through one cleaning. In such a case, the determination is made that the processing is not completed. Through repeated execution of cleaning processing over a predetermined number of times, the particles are removed off from the top surface Wf of the substrate W. The number of re-executions may be determined in advance as a processing recipe, and the cleaning processing may be repeated over thus determined number of times according to a processing recipe which is chosen appropriately.

At Step S9, the control unit 4 increases the rotation speeds of the motors for the chuck rotating mechanism 22 and the blocking-member rotating mechanism 93 and makes the substrate W and the blocking member 9 rotate at high speeds to execute drying processing of the substrate W. During this drying processing, nitrogen gas is supplied from the drying gas supplier 65 via the gas supply pipes 95 and 29, to thereby make a nitrogen gas atmosphere in the space which is sandwiched between the blocking member 9 and the top surface Wf of the substrate W and the space which is sandwiched between the spin base 23 and the rear surface Wb of the substrate W. This facilitates drying of the substrate W and shortens the drying time. After the drying processing, the substrate W stops rotating and the processed substrate W is taken out from the processing chamber 1 (Step S7). Thus, in this embodiment, Steps S2 and S3, and Steps S4 and S5 correspond to the "liquid supplying and freezing step" of the invention, and these Steps S2 through S5 correspond to the "multiply-layered frozen film forming step" of the invention. Further, Step S7 corresponds to the "removal step" of the invention.

Figure 7:
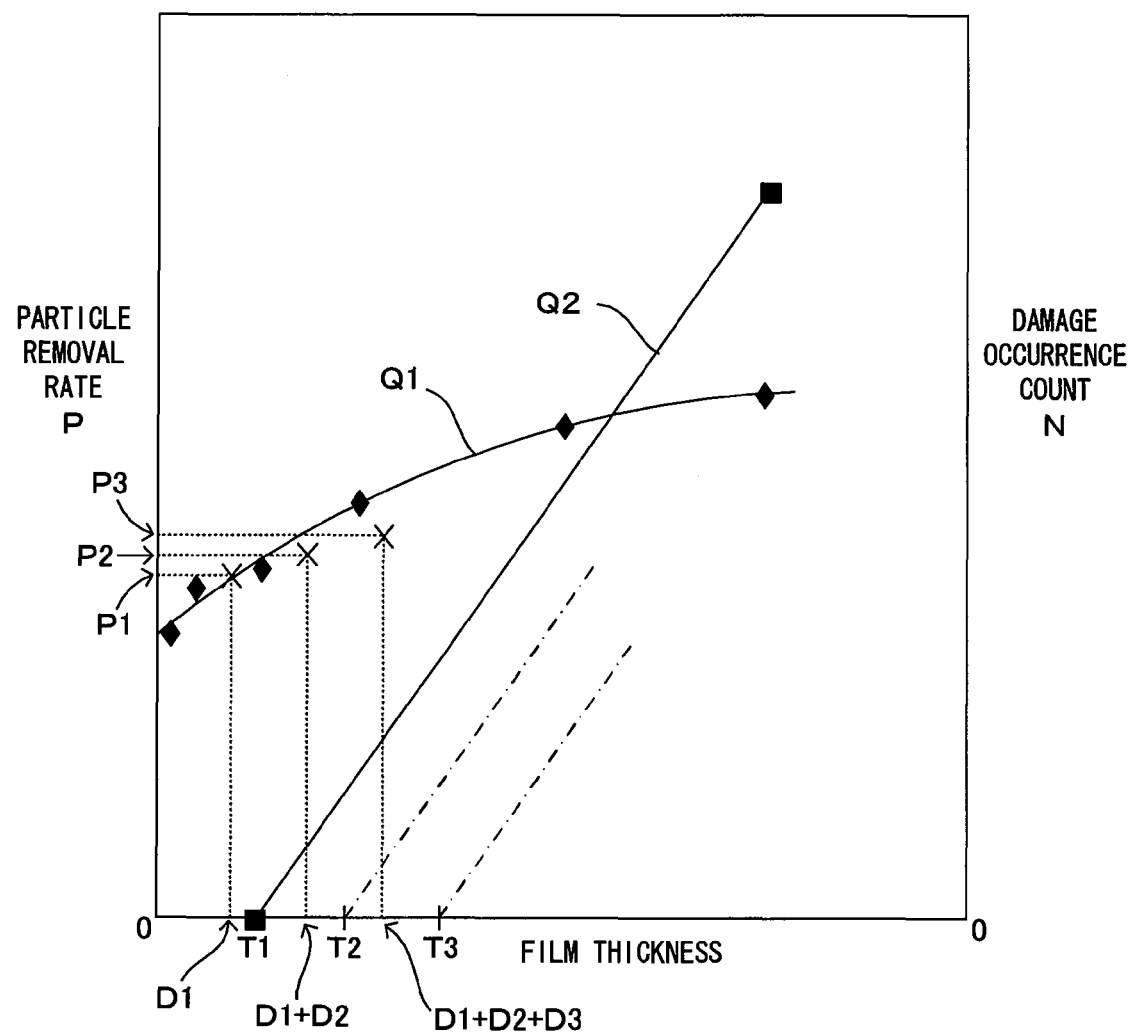
FIG. 7 is a drawing which shows the relationship between the thickness of a liquid film of DIW on a surface of a substrate and the particle removal rate, and the relationship between the film thickness and a damage occurrence count.

The effect of forming the upper layer frozen film on top of the lower layer frozen film in a layered structure will now be described with reference to FIG. 7. FIG. 7 is a drawing which shows the relationship between the thickness of a liquid film of DIW (hereinafter referred to as the "film thickness") on a surface of a substrate and the particle removal rate, and the relationship between the film thickness and a damage occurrence count. That is, FIG. 7 shows the particle removal rate and the damage occurrence count in the apparatus of FIG. 1 which has formed lower layer liquid films having various film thicknesses, frozen the lower layer liquid films, and then removed the lower layer frozen films. In FIG. 7, denoted at the solid line Q1 with the square mark ♦ is the relationship between the film thickness and the particle removal rate P, while denoted at the solid line Q2 with the square mark ■ is the relationship between the film thickness and the damage occurrence count N.

At this stage, the natures of the particle removal rate P and the damage occurrence count N will be described respectively. The higher the particle removal rate P is, the better, which is needless to mention. As denoted at the solid line Q1 in FIG. 7, the particle removal rate P gradually increases as the film thickness increases. It is thus understood that as the film thickness increases, the substrate is cleaned more favorably. In contrast, the substrate is excluded as a defective and treated as non-usable when the damage occurrence count N denoted at the solid line Q2 exceeds 0. In short, N=0 is essential to the substrate processing. Since N exceeds 0 beyond the film thickness T1, it is understood that the film thickness needs be T1 or lower.

The particle removal rate P thus increases in accordance with an increase of the film thickness and the damage occurrence count N exceeds 0, that is, N>0, when the film thickness exceeds the predetermined threshold value T1, for the following reason. That is, when the liquid film freezing processing which freezes the liquid film formed on the top surface Wf of the substrate W is executed, the liquid entering between the top surface Wf of the substrate W and the particles is frozen, whereby the volume is expanded. For example, when purified water of 0 degrees centigrade becomes ice of 0 degrees centigrade, the volume thereof increases by about 1.1 times. The pressure generated by the volume expansion acts on the particles, whereby the particles move away extremely short distances from the top surface Wf of the substrate W. This reduces the adherence between the top surface Wf of the substrate W and the particles and further separates the particles from the top surface Wf of the substrate W. When this occurs, even though there are fine patterns formed on the top surface Wf of the substrate W, when the pressure upon the patterns owing to the cubical expansion is equal in all directions, the force applied upon the patterns gets offset. Hence, it is possible to preferably remove the particles off from the top surface Wf of the substrate W, without damaging the substrate W such as peeling off or destroying the patterns.

Since the volume increase attributable to the volume expansion accelerates as the film thickness increases, the pressure acting upon the particles increases and hence the particle removal rate also increases. Meanwhile, upon increase of the film thickness and hence the pressure acting upon the particles, when the pressure applied upon the particles varies locally depending upon the application direction, the different pressures will not offset each other, and therefore, the substrate W will be damaged. Noting this, the thickness D1 of the lower layer liquid film $11f$ formed on the top surface Wf of the substrate W is D1=T1×0.8 for instance in this embodiment. In other words, the film thickness D1 is set to 80% of the film thickness threshold value T1 which causes the damage occurrence count N to exceed 0, to thereby ensure that the damage occurrence count N is always 0 without fail. The film thickness of the lower layer liquid film $11f$ is adjusted by the adjustment of the number of revolution of the spin chuck 2 which is performed by the control of the operation of the chuck rotating mechanism 22. In this embodiment, the chuck rotating mechanism 22 thus corresponds to the "lower layer film thickness adjuster" of the invention.

At this stage, as denoted at the solid line Q1 in FIG. 7, the particle removal rate P satisfies P=P1, which means that with a single layer frozen film formation, it is not possible to attain the particle removal rate which is greater than P1 in order to securely prevent the damage occurrence count N from exceeding 0. In connection with this, consideration will now be given on an instance of forming the upper layer frozen film $14f$, which is obtained by freezing the upper layer liquid film $12f$ having the film thickness D2, on top of the lower layer frozen film $13f$ which is obtained by freezing the lower layer liquid film $11f$ having the film thickness D1 in the manner described above. The film thickness of the upper layer liquid film $12f$ as well is adjusted by the adjustment of the number of revolution of the spin chuck 2 which is performed by the control of the operation of the chuck rotating mechanism 22.

In this instance, while the film thickness of the frozen films as a whole is (D1+D2), the pressure working upon particles owing to the upper layer frozen film $14f$ works indirectly via the lower layer frozen film $13f$. Hence, an increase of the pressure upon particles due to a volume expansion of the upper layer frozen film $14f$ is smaller than an increase of the pressure attributable to a single layer frozen film having the film thickness (D1+D2) over the pressure attributable to a single layer frozen film having the film thickness D1. The particle removal rate with the upper layer frozen film $14f$ formed on top of the lower layer frozen film $13f$ in a layered structure is therefore down to P2 which is smaller than the value denoted at the solid line Q1 which corresponds to the film thickness (D1+D2). In the meantime, the damage occurrence count N is maintained at 0 in this instance although the film thickness (D1+D2) is greater than the threshold value T1. That is, where the upper layer frozen film $14f$ is formed on the lower layer frozen film $13f$ in a layered structure, the film thickness threshold value which causes the damage occurrence count N to exceed 0 changes to T2 from T1, as shown in FIG. 7.

Further consideration will now be given on an instance of forming an upper layer frozen film, which is obtained by freezing an upper layer liquid film having the film thickness D3, on top of the upper layer frozen film $14f$, namely, an instance that the predetermined value at Step S6 in FIG. 6 is 2. In this instance, while the film thickness of the frozen films as a whole is (D1+D2+D3), the pressure working upon particles owing to this upper layer frozen film in the area where the film thickness is D3 works indirectly via the lower layer frozen film $13f$ and further via the upper layer frozen film $14f$.

Hence, an increase of the pressure upon particles due to a volume expansion of this upper layer frozen film is even smaller than that arising due to a single layer frozen film. The particle removal rate is therefore down to P3 which is smaller than the value denoted at the solid line Q1 which corresponds to the film thickness (D1+D2+D3). In the meantime, the damage occurrence count N is maintained at 0 in this instance although the film thickness (D1+D2+D3) is greater than the threshold value T2 described above. That is, where two upper layer frozen films are formed on the lower layer frozen film $13f$ in a layered structure, the film thickness threshold value which causes the damage occurrence count N to exceed 0 shifts further to T3 which is greater than T2, as shown in FIG. 7.

As described above, according to this embodiment, since the upper layer frozen film $14f$ is superimposed in a layered structure on top of the lower layer frozen film $13f$ which is formed on the surface Wf of the substrate W, and the frozen films $13f$ and $14f$ as a whole are melted and accordingly removed, it is possible to enhance the particle removal rate while preventing damage upon the substrate W. In addition, it is possible to prevent melting of the lower layer frozen film $13f$ before forming the upper layer frozen film $14f$ on top of the lower layer frozen film $13f$ in a layered structure, since for the purpose of superimposing the upper layer frozen film $14f$, DIW supplied onto the lower layer frozen film $13f$ is cooled to a temperature at which the lower layer frozen film $13f$ will not be melted, the temperature being 5 degrees centigrade or lower for instance.

Further, according to this embodiment, it is possible to shorten the time needed to form the lower layer frozen film $13f$ and the upper layer frozen film $14f$ since the temperature adjuster 623 cools DIW supplied onto the substrate W for the purpose of forming the lower layer liquid film $11f$ and the upper layer liquid film $12f$ down to 5 degrees centigrade or below for example. That is, an experiment conducted by the inventor has identified that the time needed for freezing a liquid film is mostly used to cool down the temperature of the liquid which composes the liquid film to the vicinity of the freezing point. Noting this, in this embodiment, the DIW supplied onto the substrate W is cooled in advance. Since this shortens the time needed to decrease the temperature of the lower layer liquid film $11f$ and the upper layer liquid film $12f$ down to near the freezing point, it is possible to shorten the time needed to freeze the liquid films. The time needed for the cleaning processing is consequently shortened, which improves the throughput of the substrate processing.

Further, in this embodiment, the cooling gas discharge nozzle 3 discharges, toward a local section of the top surface Wf of the substrate W, the cooling gas whose temperature is lower than the freezing point of the liquid which composes the lower layer liquid film $11f$ and the upper layer liquid film $12f$ formed on the top surface Wf of the substrate W. The cooling gas discharge nozzle 3 then moves between the rotational center position Pc of the substrate W and the edge position Pe of the substrate W while the substrate W remain rotating, whereby the lower layer frozen film $13f$ and the upper layer frozen film $14f$ are formed all over the top surface Wf of the substrate W. This limits a section receiving supply of the cooling gas to a very narrow area on the top surface Wf of the substrate W, which in turn minimizes a decrease of the temperatures of the substrate peripheral members such as the spin chuck 2. It is therefore possible to form the lower layer frozen film $13f$ and the upper layer frozen film $14f$ all over the top surface Wf of the substrate W while suppressing deterioration of the substrate peripheral members. As a result, even when the substrate peripheral members are made of a chemical-resistant resin material with which it is hard to secure the resistance against cold energy, degradation of the material of the substrate peripheral members due to cold energy can be suppressed.

Further, according to this embodiment, it is possible to repeatedly perform the liquid film forming processing, the liquid film freezing processing and the frozen film removal processing inside the same processing chamber 1 for the predetermined times. It is therefore possible to securely remove off from the top surface Wf of the substrate W those particles which can not be removed from the top surface Wf of the substrate W through only single execution of the liquid film freezing processing and the frozen film removal processing.

Further, according to this embodiment, execution of the frozen film removal processing is started before the lower layer frozen film 13f and the upper layer frozen film 14f have been melted. This makes it possible to prevent particles fallen off from the top surface Wf of the substrate W at the liquid film freezing processing from re-adhering to the top surface Wf of the substrate W again as the frozen film gets melted. It is therefore possible to efficiently remove the particles together with the frozen film off from the top surface Wf of the substrate W through execution of the frozen film removal processing, which is advantageous in improving the particle removal rate.

In other words, the embodiment comprises a liquid supplier which supplies a liquid toward a surface of a substrate, and a freezing unit which freezes a liquid film which is formed on the substrate surface by the supply of the liquid performed by the liquid supplier. And in the embodiment, a supply of the liquid toward a surface of a lower layer frozen film which is formed by the freezing of the liquid film performed by the freezing unit and freezing of thus supplied liquid are executed at least once to thereby form an upper layer frozen film on top of the lower layer frozen film in a layered structure, and then the entire frozen films formed on the substrate surface are removed.

According to this structure, the liquid supplier supplies the liquid toward the substrate surface and the freezing unit freezes the liquid film formed on the substrate surface as a result of the supply of the liquid. This is followed by supply of the liquid toward a surface of the lower layer frozen film formed as a result of the liquid film freezing performed by the freezing unit and freezing of thus supplied liquid for at least one time, so that the upper layer frozen film is formed on top of the lower layer frozen film in a layered structure. The frozen film consisting of at least two layers is consequently formed on the substrate surface, and the entire frozen film is removed.

Further, the embodiment comprises a multiply-layered frozen film forming step of repeating more than once a liquid supplying and freezing step of supplying a liquid toward a substrate surface and freezing thus supplied liquid, to thereby form a frozen film with plural layers in a layered structure on the substrate surface, and a removal step of removing the entire frozen film with plural layers.

According to this structure, the liquid supplying and freezing step of supplying the liquid toward the substrate surface and freezing thus supplied liquid is repeated multiple times, to thereby form the frozen film with plural layers in a layered structure on the substrate surface, and then, the entire frozen film with plural layers formed on the substrate surface is removed.

By the way, through various experiments, the inventor found that as the thickness of a liquid film increases, the particle removal rate increases and that when the thickness of a liquid film exceeds a certain value, a substrate is damaged. An increase of the particle removal rate is believed to be because the pressure which develops due to volume expansion upon freezing of the liquid film and acts upon particles increases as the thickness of a liquid film increases. Meanwhile, it is considered that the reason why damage occurs is because the pressure acts on not only the particles but a surface of the substrate as well and therefore as the thickness of the liquid film exceeds a certain value, the pressure becomes excessive and adversely affects the substrate surface.

In light of this, the embodiment forms a frozen film consisting of at least two layers, namely, forms a frozen film with plural layers. The film thickness is larger than where there only is a frozen film with a first layer, which increases the pressure which develops due to volume expansion of the liquid film associated with freezing of the liquid film and acts upon particles. It is thus possible to enhance the particle removal rate than where a frozen film with a first layer alone is formed. Meanwhile, since the pressure which acts on the substrate surface from a frozen film of a second layer indirectly works via the frozen film of the first layer, the pressure which develops due to volume expansion and acts on the substrate surface increases less as compared with the value of the pressure due to the frozen film of the first layer. Further, as for the pressures owing to a frozen film of a third layer and subsequent layers for instance, since the pressures act via the frozen films of the lower layers, the pressures increase even less. It is hence possible to avoid damaging of the substrate because of the pressures from the frozen film of the second layer and the subsequent layers. Thus, according to the embodiment, as the number of the layers which form the upper layer frozen film for example is adjusted, it is easy to adjust the pressure which acts on particles and the substrate surface, and it is possible to facilitate removal of the particles while preventing damaging of the substrate.

Further, the embodiment comprises a lower layer film thickness adjuster which adjusts a thickness of the liquid film which is formed on the substrate surface by the supply of the liquid performed by the liquid supplier to a predetermined value. Therefore, the thickness of a liquid film which is formed on the substrate surface by the supply of the liquid by the liquid supplier is adjusted to the predetermined value. Here, the predetermined value may be a value which is sufficiently different from the threshold value which starts causing damaging of the substrate, a value which is about 80% of this threshold value for instance. This makes it possible to securely prevent damaging of the substrate.

Further, in the embodiment, the freezing unit includes a cooling gas discharger which discharges a cooling gas whose temperature is lower than the freezing point of the liquid toward a local section of the substrate surface, and a relative moving mechanism which relatively moves the cooling gas discharger relative to the substrate and parallel to the substrate surface. And, the relative moving mechanism relatively moves the cooling gas discharger relative to the substrate while the cooling gas discharger discharges the cooling gas, whereby the respective frozen films are formed.

According to this structure, the cooling gas discharger discharges the cooling gas whose temperature is lower than the freezing point of the liquid locally toward the substrate surface. While the cooling gas discharger discharges the cooling gas, the relative moving mechanism relatively moves the cooling gas discharger relative to the substrate and parallel to the substrate surface, thereby forming the lower layer frozen film and forming the upper layer frozen film in a layered structure. That is, as the relative movement progresses, an area where the liquid, of the liquid on the substrate, is frozen spreads, and the frozen film is formed on the entire surface of the substrate. Since a section to which the cooling gas is supplied is thus limited to a partial region in the substrate surface, it is possible to minimize a decrease of the temperature of a member which is disposed around the substrate, a member for holding the substrate for instance. Hence, it is possible to suppress deterioration of such members.

Further, in the embodiment, the supply of the liquid toward the surface of the lower layer frozen film is performed by the liquid supplier, and the liquid supplier includes a temperature adjuster which cools down the liquid to a temperature at which the supply of the liquid does not melt the lower layer frozen film. According to this structure, the liquid is supplied toward the surface of the lower layer frozen film by the liquid supplier which includes the temperature adjuster which cools down the liquid to a temperature at which the supply of the liquid does not melt the lower layer frozen film. Hence, it is possible to securely prevent the lower layer frozen film from melting, which makes it possible to favorably form the upper layer frozen film in a layered structure. In addition, the liquid supplier can be used to form both the lower layer frozen film and the upper layer frozen film in a layered structure, which in turn reduces the number of parts and simplifies the structure of the apparatus.

Further, in the embodiment, the liquid is deionized water. Consequently, when the temperature adjuster cools down the temperature of the liquid to 0 through 2 degrees centigrade, it is preferable that the liquid does not freeze since the temperature thereof is not less than 0 degrees centigrade. Further, it is also preferable that the melting of the lower layer is securely prevented since the liquid is cooled down to 2 degrees centigrade or below.

Second Embodiment

Figure 8:
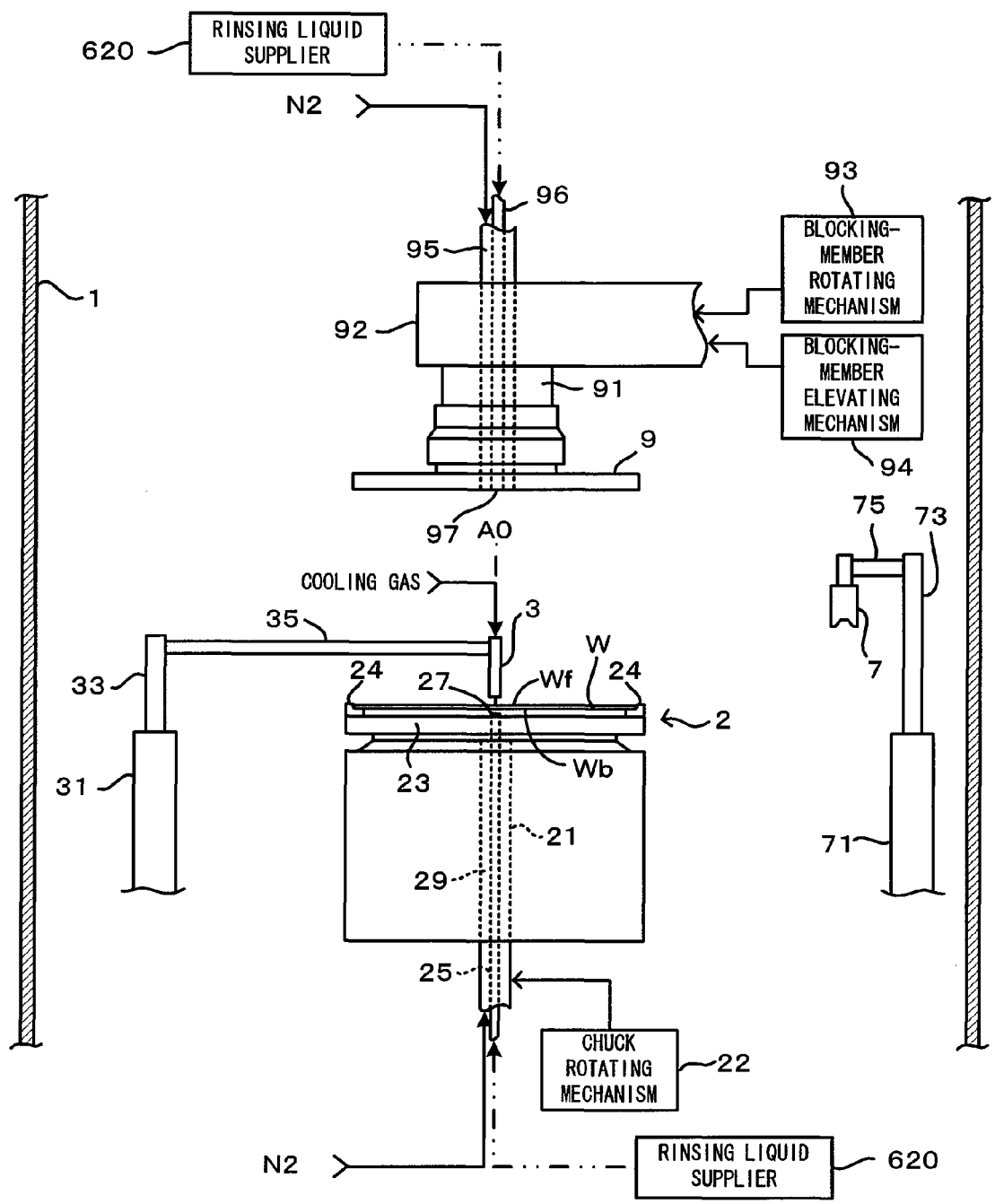
FIG. 8 is a diagram showing a second embodiment of a substrate processing apparatus according to the invention.
Figure 9:
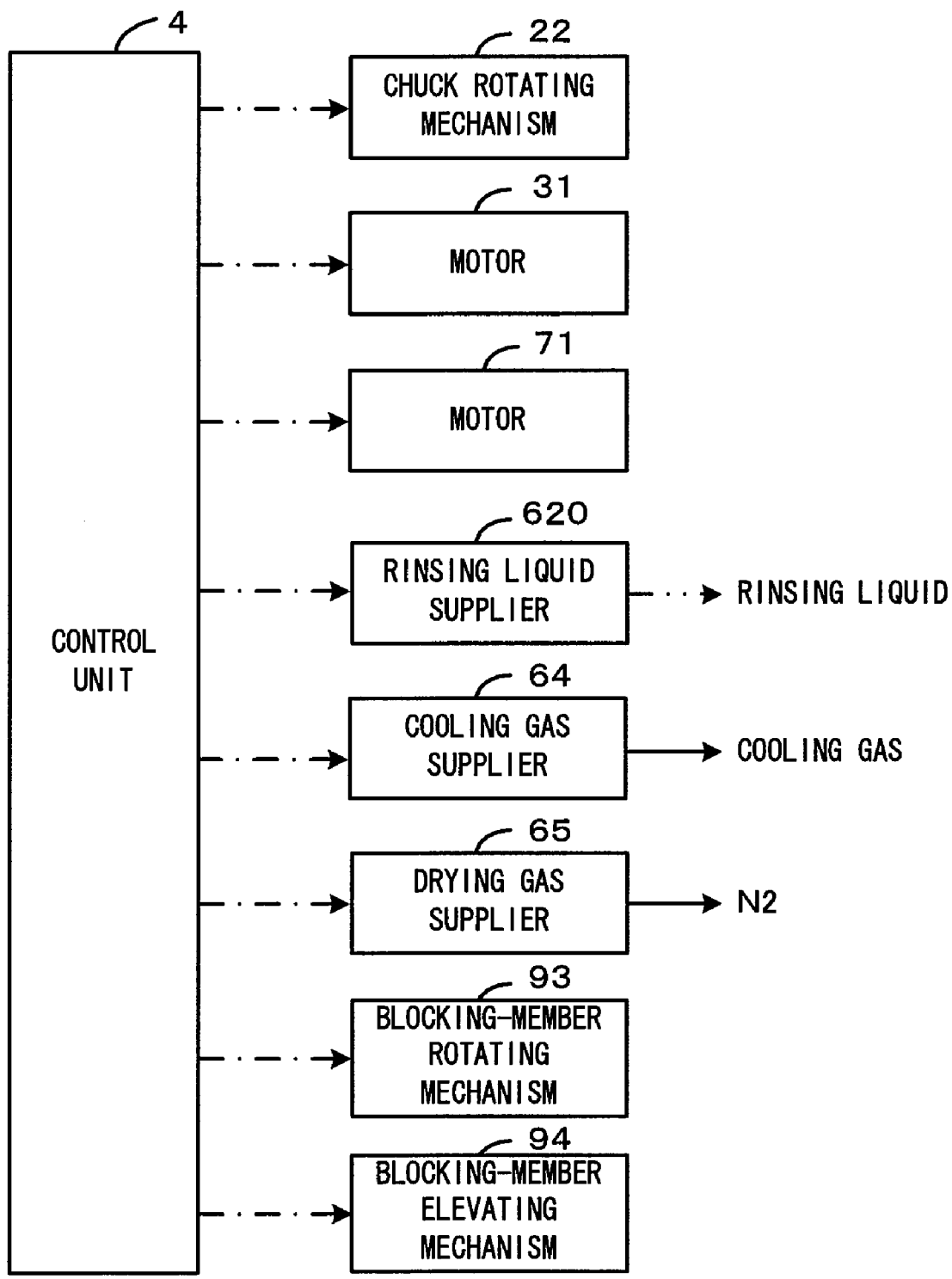
FIG. 9 is a block diagram which shows the control structure of the substrate processing apparatus of FIG. 8.

FIG. 8 is a diagram showing a second embodiment of a substrate processing apparatus according to the invention, and FIG. 9 is a block diagram which shows the control structure of the substrate processing apparatus of FIG. 8. The second embodiment is quite different from the first embodiment in that DIW is supplied as a mist-generating nozzle 7 discharges minute droplets toward the surface of the lower layer frozen film 13*f* for the purpose of forming the upper layer frozen film, and the rinsing liquid supplier 62 is replaced with a rinsing liquid supplier 620. The rinsing liquid supplier 620 is different from the rinsing liquid supplier 62 only in that it does not comprise the temperature adjuster, but is otherwise identical in structure to the rinsing liquid supplier 62. That is, DIW supplied to the substrate W from the rinsing liquid supplier 620 for the purpose of forming the lower layer liquid film is not cooled but is at room temperature. The same parts as those of the first embodiment will be denoted at the same reference symbols below.

A motor 71 is disposed at a place outward from the spin chuck 2 in a circumferential direction. A rotary shaft 73 is connected to the motor 71, an arm 75 extending horizontally is connected to the rotary shaft 73, and the mist-generating nozzle 7 is attached to the end of the arm 75. When the motor 71 is driven in accordance with an operation command from the control unit 4, the arm 75 swings around the rotary shaft 73.

Figure 10:
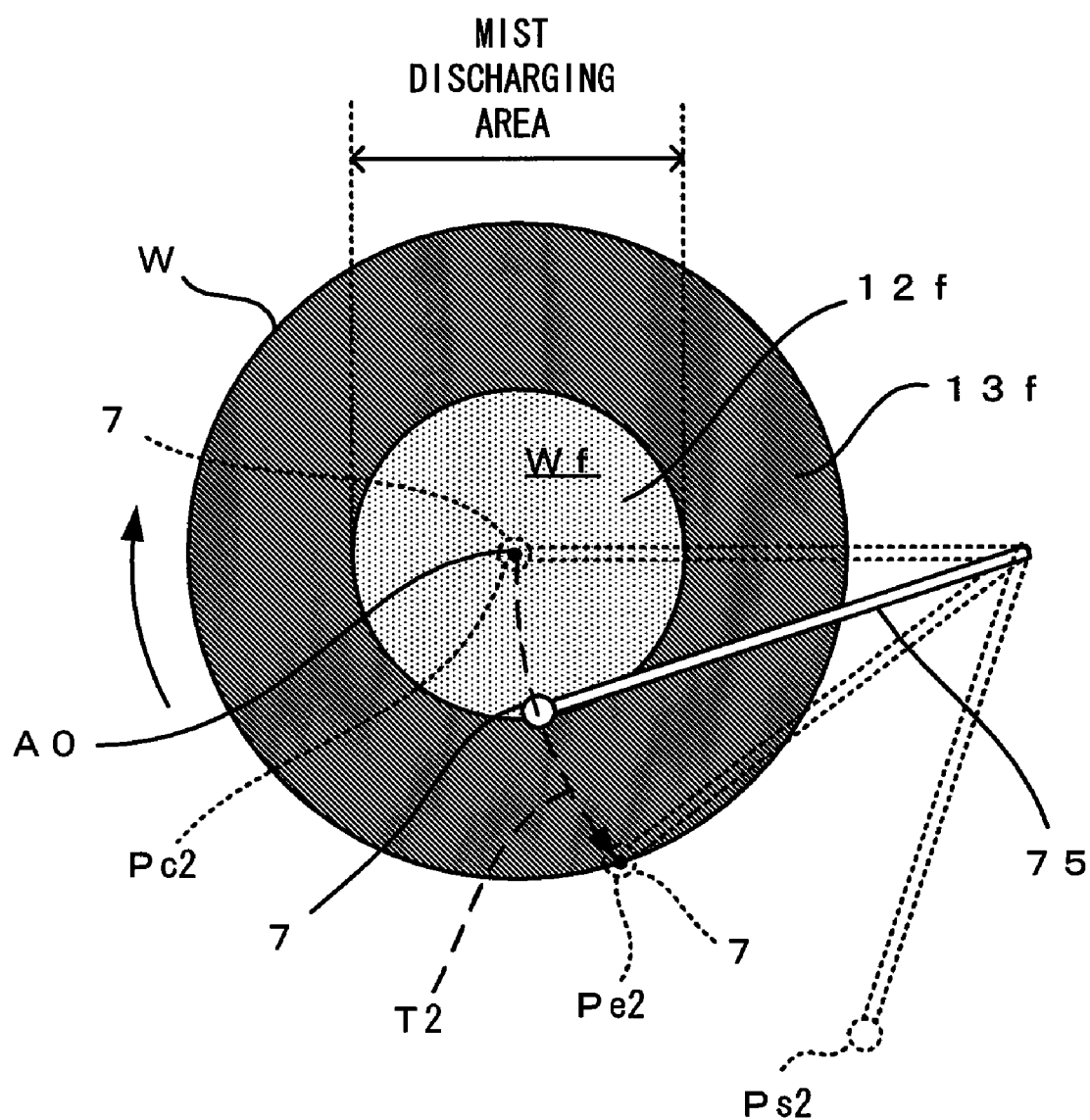
FIG. 10 is a plan view showing a movement of the mist-generating nozzle.

FIG. 10 is a plan view showing a movement of the mist-generating nozzle. When the motor 71 is driven and the arm 75 swings in accordance with an operation command from the control unit 4, the mist-generating nozzle 7 moves along a moving trajectory T2 as shown in FIG. 10 while staying opposed to the top surface Wf of the substrate W. The moving trajectory T2 is a trajectory from a rotation center position Pc2 toward an edge position Pe2. The rotation center position Pc2 is over the substrate W and above the rotation center A0 of the substrate W, and the edge position Pe2 is above the outer circumferential edge of the substrate W. That is, the motor 71 relatively moves the mist-generating nozzle 7 relative to the substrate W and parallel to the top surface Wf of the substrate W. The mist-generating nozzle 7 is further capable of moving to a stand-by position Ps2 which is on an extension of the moving trajectory T2 and off to the side from its opposed position to the substrate W.

The mist-generating nozzle 7 is connected with the rinsing liquid supplier 620. When the mist-generating nozzle 7 is arranged at an opposed position to the top surface Wf of the substrate W and the rinsing liquid supplier 620 supplies DIW to the mist-generating nozzle 7, the mist-generating nozzle 7 discharges the DIW as minute droplets toward the top surface Wf of the substrate W. When the motor 71 moves the mist-generating nozzle 7 along the moving trajectory T2 while the chuck rotating mechanism 22 rotates the substrate W, with minute droplets of the DIW discharged from the mist-generating nozzle 7 in accordance with an operation command from the control unit 4, the minute droplets of the DIW are supplied to the entire top surface Wf of the substrate W. In this embodiment, the mist-generating nozzle 7 and the rinsing liquid supplier 620 thus correspond to the "droplet supplier" of the invention.

Figure 11A:
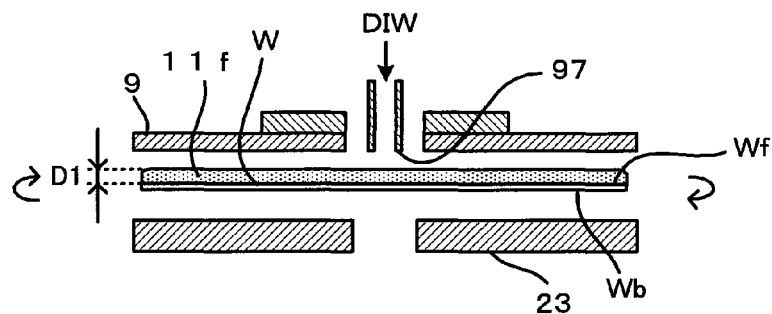
FIGS. 11A through 11D are diagrams showing processing to the top surface Wf of the substrate W.
Figure 11B:
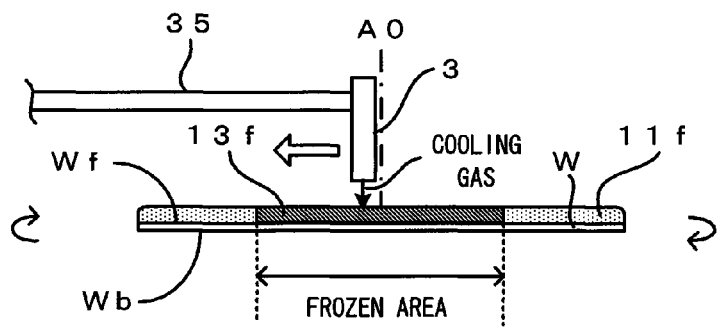
Figure 11C:
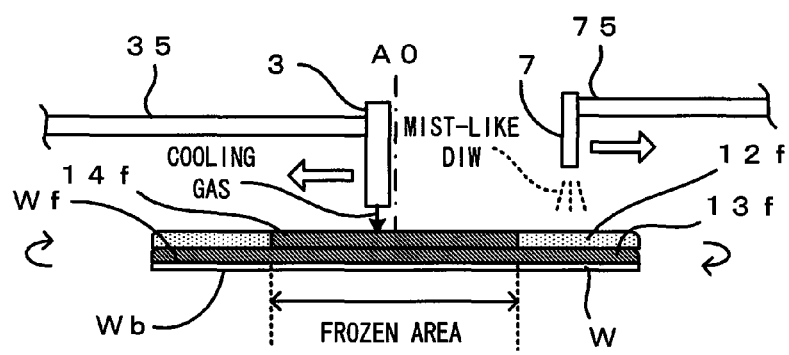
Figure 11D:
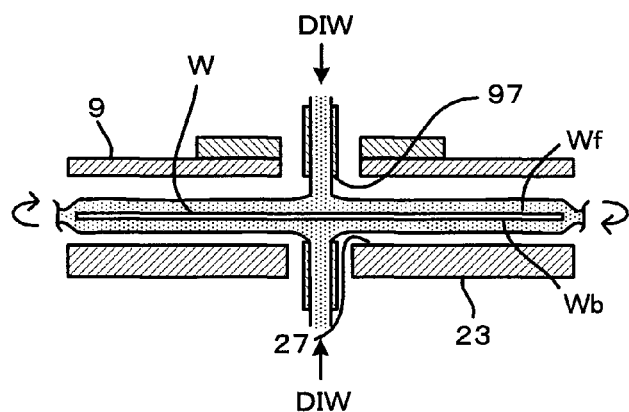
Figure 12:
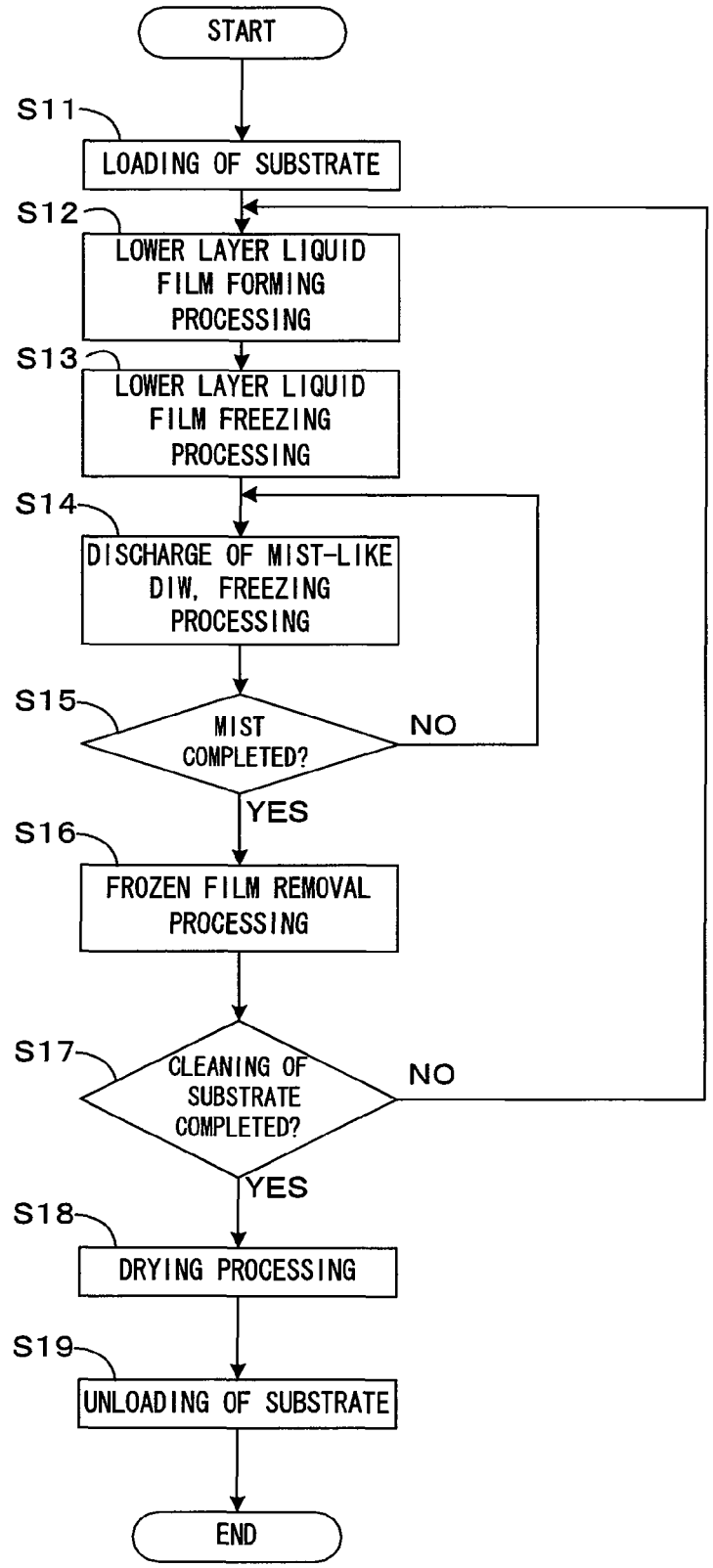
FIG. 12 is a flow chart showing an operation sequence of the substrate processing apparatus shown in FIG. 8.

Next, a cleaning processing operation performed by the substrate processing apparatus having the structure above will be described with reference to FIGS. 11A through 11D and 12. FIGS. 11A through 11D are diagrams showing processing to the top surface Wf of the substrate W, FIG. 11A showing a lower layer liquid film forming processing, FIG. 11B showing a lower layer liquid film freezing processing, FIG. 11C showing an upper layer liquid film forming and freezing processing, and FIG. 11D showing a frozen film removal processing. FIG. 12 is a flow chart showing an operation sequence of the substrate processing apparatus shown in FIG. 8.

FIGS. 11A and 11B are the same as FIGS. 5A and 5B, and Steps S11 to S13 in FIG. 12 are the same as Steps S1 to S3 in FIG. 6. Upon completion of the lower layer liquid film freezing processing at Step S13, the control unit 4 activates the chuck rotating mechanism 22 to rotate the spin chuck 2, positions the mist-generating nozzle 7 to the rotation center position Pc2, and gradually moves the mist-generating nozzle 7 toward the edge position Pe2 of the substrate W while, by activating the rinsing liquid supplier 620, discharging mist-like DIW as droplets toward the top surface Wf of the substrate W from the mist-generating nozzle 7, to thereby form the upper layer liquid film 12*f* at Step S14. At the same time, the control unit 4 returns the cooling gas discharge nozzle 3 to the rotation center position Pc after the mist-generating nozzle 7 has left the rotation center position Pc2, and while causing the cooling gas to be discharged from the cooling gas discharge nozzle 3 toward the top surface Wf of the rotating substrate W, gradually moves the cooling gas discharge nozzle 3 toward the edge position Pe2 of the substrate W. In consequence, as shown in FIG. 11C, within the top surface Wf of the substrate W, while the upper layer liquid film 12*f* is being formed, the frozen area spreads from a central section of the top surface Wf of the substrate W toward a peripheral section, whereby the upper layer frozen film 14*f* is formed all over the top surface Wf of the substrate W. Since the DIW forming the upper layer liquid film 12f, although not cooled, is supplied as mist-like droplets to the surface of the lower layer frozen film 13f, it is possible to favorably form the upper layer frozen film 14f in a layered structure without melting the lower layer frozen film 13f.

Whether the discharge of the mist-like DIW has finished is then determined (Step S15), and Step S14 is continued when the discharge has not finished yet (NO at Step S15), whereas the operation proceeds to Step S16 when it is determined that the discharge has finished since a predetermined time has elapsed for example (YES at Step S15). During this, the control unit 4 can adjust the film thickness of the upper layer liquid film 12f by controlling the discharging time of the mist-like DIW from the mist-generating nozzle 7.

The frozen film removal processing at Step S16 is identical as Step S7 in FIG. 6, and FIG. 11D is the same as FIG. 5E. The following Steps S17 to S19 are the same as Steps S8 to S10 in FIG. 6. In this embodiment, each one of Step S12, Step S13 and Step S14 thus corresponds to the "liquid supplying and freezing step" of the invention, and these Steps S12 to S14 correspond to the "multiply-layered frozen film forming step" of the invention. Further, Step S16 corresponds to the "removal step" of the invention.

As described above, according to this embodiment, since the upper layer frozen film 14f is formed in a layered structure on top of the lower layer frozen film 13f which is formed on the top surface Wf of the substrate W and the frozen films 13f and 14f as a whole are melted and accordingly removed as in the first embodiment described earlier, it is possible to enhance the particle removal rate while preventing damage upon the substrate W. In addition, the lower layer frozen film 13f will not melt even without cooling of the DIW, since, for the purpose of forming the upper layer frozen film 14f in a layered structure, minute droplets of DIW are discharged toward the surface of the lower layer frozen film 13f. Therefore, the embodiment has an advantage that a structure for cooling the DIW is unnecessary.

Further, in this embodiment, since the cooling gas discharge nozzle 3 discharges the cooling gas while minute droplets of DIW are discharged toward the surface of the lower layer frozen film 13f, it is possible to more securely prevent the lower layer frozen film 13f from melting.

In other words, this embodiment comprises a droplet supplier which discharges minute droplets of the liquid and accordingly supplies the liquid toward the surface of the lower layer frozen film. According to this structure, since minute droplets of the liquid are discharged toward the surface of the lower layer frozen film, an advantage is obtained that it is possible to prevent melting of the lower layer frozen film even without cooling the liquid by means of a temperature adjuster or the like for instance.

Further, in this embodiment, the freezing of the liquid is executed while the droplet supplier discharges minute droplets of the liquid toward the surface of the lower layer frozen film. According to this structure, since the liquid is frozen while the droplet supplier discharges minute droplets of the liquid toward the surface of the lower layer frozen film, it is possible to favorably form a single layer of the upper layer frozen film on the surface of the lower layer frozen film while preventing the lower layer frozen film from melting without fail. At this stage, it is possible to adjust the film thickness of the upper layer frozen film by adjusting the liquid discharging time of discharging minute droplets of the liquid from the droplet supplier for example.

<Others>

The invention is not limited to the embodiments described above but may be modified in various manners in addition to the embodiments above, to the extent not deviating from the object of the invention. For instance, in the above first embodiment, although the temperature adjuster 623 cools DIW supplied onto the top surface Wf of the substrate W for the purpose of forming the lower layer liquid film 11f, the invention does not demand cooling of the DIW for forming the lower layer liquid film 11f. However, since the lower layer frozen film 13f can be formed in a short period of time if the DIW is cooled, cooling of the DIW is preferable.

Further, in the above second embodiment, although at Step S14 in FIG. 12, the cooling gas discharge nozzle 3 discharges the cooling gas while the mist-generating nozzle 7 discharges minute droplets of the DIW, this is not limiting. For example, as in the first embodiment, after forming the upper layer liquid film 12f with discharge of minute droplets of the DIW from the mist-generating nozzle 7, the upper layer liquid film 12f may be frozen with discharge of the cooling gas from the cooling gas discharge nozzle 3 to thereby form the upper layer frozen film 14f in a layered structure.

Further, in the embodiments above, the frozen films 13f and 14f are formed only on the top surface Wf of the substrate W. However, the invention is not limited to this. The lower frozen film may be formed also on the rear surface Wb of the substrate W and the upper layer frozen film may be formed on the lower frozen film in a layered structure. According to this modification, it is possible to weaken the adherence between particles and the substrate W not only at the top surface Wf of the substrate W but also at the rear surface Wb of the substrate W. Hence, it is possible to preferably remove particles from the rear surface Wb of the substrate W.

Figure 13A:
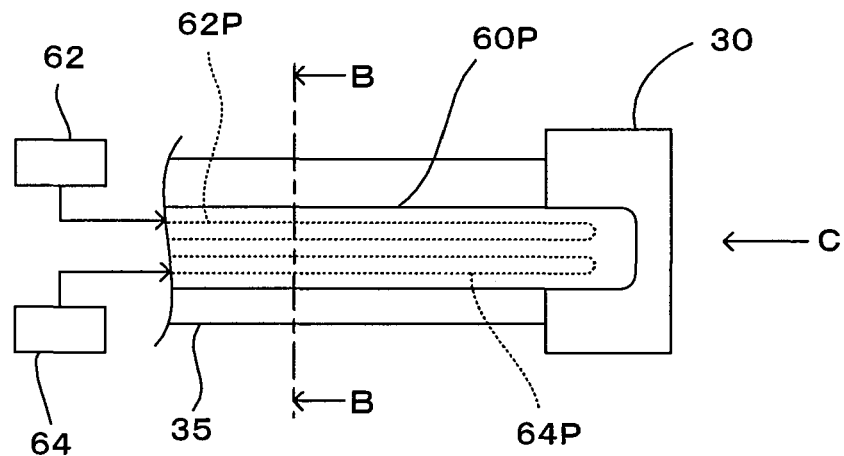
FIGS. 13A to 13C are diagrams showing a modification of discharge of the rinsing liquid.
Figure 13B:
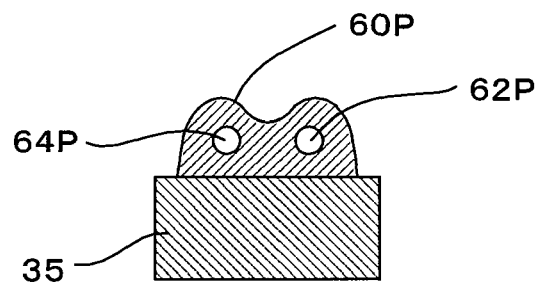
Figure 13C:
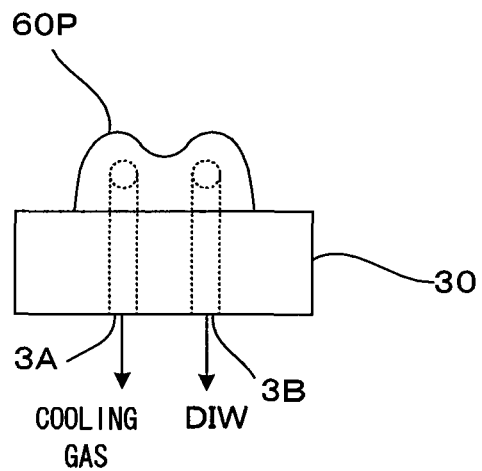

Further, in the above first and the second embodiments, although the liquid film 11f is formed on the top surface Wf of the substrate W with the DIW which is discharged from the rinsing liquid discharging nozzle 97 which is disposed at the under surface of the blocking member 9, this is not limiting. FIGS. 13A to 13C are diagrams showing a modification of discharge of the rinsing liquid, FIG. 13A being a plan view, FIG. 13B being a cross sectional view taken along the line B-B in FIG. 13A, and FIG. 13C being a side view taken in the direction of the arrow C in FIG. 13A.

According to this modification shown in FIGS. 13A to 13C, a discharge part 30 is disposed at the tip of the arm 35, and a supply tube 60P is installed on the top surface extending from the arm 35 to the discharge part 30. Disposed inside the supply tube 60P are a liquid supply pipe 62P which is communicated with the rinsing liquid supplier 62 and a gas supply pipe 64P which is communicated with the cooling gas supplier 64. In other words, the liquid supply pipe 62P and the gas supply pipe 64P are disposed side by side in the vicinity of each other. The cooling gas is discharged at a gas discharge outlet 3A which is formed in the discharge part 30 and is communicated with the gas supply pipe 64P, whereas the DIW is discharged at a liquid discharge outlet 3B which is formed near the gas discharge outlet 3A of the cooling gas discharge nozzle 3 and is communicated with the liquid supply pipe 62P.

Since the liquid supply pipe 62P carrying the DIW is disposed in the vicinity of the gas supply pipe 64P which carries the cooling gas which is at such an extremely low temperature as −100 degrees centigrade for example, this modification has an advantage that the cold energy of the cooling gas works to prevent the temperature of DIW which has been cooled down to a lower temperature than room temperature by the temperature adjuster 623 from rising. Further, according to this modification, since the liquid discharge outlet 3B for discharging the DIW is disposed in the vicinity of the gas discharge outlet 3A for discharging the cooling gas, it is possible to enhance the cooling effect exerted upon the DIW by the cooling gas. In this modification, the gas discharge outlet 3A thus corresponds to the "cooling gas discharger" of the invention and the liquid discharge outlet 3B thus corresponds to the "liquid discharge nozzle" of the invention.

In other words, in this modification, the liquid supplier includes a liquid supply pipe which supplies the liquid and a liquid discharge nozzle which discharges the liquid inside the liquid supply pipe toward the substrate, the freezing unit further includes a gas supply pipe which guides the cooling gas to the cooling gas discharger, and at least a part of the liquid supply pipe and at least a part of the gas supply pipe are disposed side by side in the vicinity of each other.

According to this structure, since at least a part of the liquid supply pipe which supplies the liquid and at least a part of the gas supply pipe which guides the cooling gas are disposed side by side in the vicinity of each other, the liquid supplied to the substrate flows near the cooling gas whose temperature is lower than the freezing point of the liquid. Since the liquid supplied to the substrate is accordingly cooled, melting of the lower layer frozen film is prevented. At this stage, when the temperature of the cooling gas is extremely low, about −100 degrees centigrade for example, the cooling effect on the liquid which passes near the cooling gas is very significant.

Further, in this modification, the liquid discharge nozzle and the cooling gas discharger are disposed in the vicinity of each other, and the relative moving mechanism relatively moves the liquid discharge nozzle and the cooling gas discharger as one unit relative to the substrate. According to this structure, the liquid discharge nozzle and the cooling gas discharger disposed in the vicinity of each other are relatively moved as one unit, and these are always positioned close to each other. Consequently, when the cooling gas discharger discharges the cooling gas, the coolness of the cooling gas cools the liquid discharge nozzle. Hence, the embodiment has an advantage that the melting of the lower layer frozen film is more securely prevented.

Figure 14:
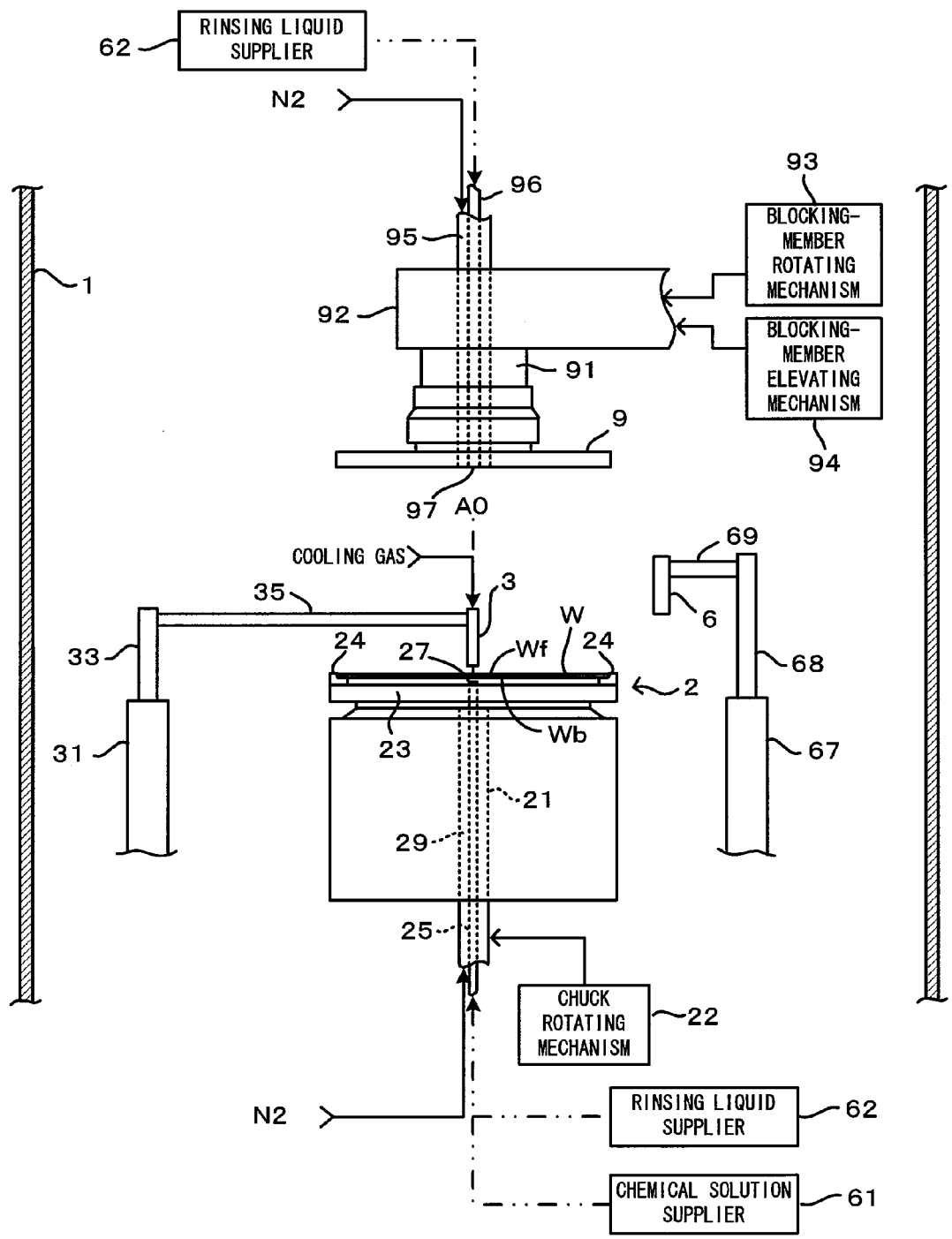
FIG. 14 is a diagram showing a modification in which a structure for chemical cleaning is added to the apparatus of the first embodiment.

Further, whole of the lower layer frozen film $13f$ and the upper layer frozen film $14f$ which are formed on the top surface Wf of the substrate W in a layered structure are removed by means of the DIW supplied from the rinsing liquid supplier 62 in the above first embodiment, and by means of the DIW supplied from the rinsing liquid supplier 620 in the above second embodiment, respectively. However, the invention is not limited to this. The frozen film may be removed through chemical cleaning. FIG. 14 is a diagram showing a modification in which a structure for chemical cleaning is added to the apparatus of the first embodiment. FIG. 15 is a diagram showing a frozen film removal processing in the apparatus shown in FIG. 14. In this modification, the liquid supply pipe 25 is connected also to a chemical solution supplier 61 in addition to the rinsing liquid supplier 62. The chemical solution supplier 61 supplies a chemical solution such as an SC1 solution (a liquid mixture of aqueous ammonia and a hydrogen peroxide solution). The apparatus is structured so that either one of the chemical solution or DIW is selectively supplied to the liquid discharge nozzle 27 via the liquid supply pipe 25.

A motor 67 is disposed at a place outward from the spin chuck 2 in a circumferential direction. A rotary shaft 68 is connected to the motor 67, an arm 69 extending horizontally is connected to the rotary shaft 68, and a chemical solution discharge nozzle 6 is attached to the end of the arm 69. When the motor 67 is driven in accordance with an operation command from the control unit 4, the chemical solution discharge nozzle 6 moves in reciprocation between a discharging position above the rotation center A0 of the substrate W and a stand-by position away sideward from the discharging position. The chemical solution discharge nozzle 6 is connected to the chemical solution supplier 61 and discharges the chemical solution supplied from the chemical solution supplier 61 toward the top surface Wf of the substrate W which is held by the spin chuck 2.

In this modification, after forming the frozen film in a layered structure, the control unit 4 positions the chemical solution discharge nozzle 6 at the discharging position and the SC1 solution is pressure fed into the chemical solution discharge nozzle 6 and is supplied to the liquid discharge nozzle 27. This causes the SC1 solution to be supplied from the chemical solution discharge nozzle 6 to the top surface Wf of the substrate W and from the liquid discharge nozzle 27 to the rear surface Wb of the substrate W. Since the zeta potential (electrokinetic potential) at the surface of the solid matter in the SC1 solution has a relatively large value, when the area between the particles on the top surface Wf of the substrate W and the top surface Wf of the substrate W are filled with the SC1 solution, significant repulsive force acts between the particles and the top surface Wf of the substrate W. This makes it even easier for the particles to fall off from the top surface Wf of the substrate W and achieves effective removal of the particles from the top surface Wf of the substrate W. Further, in this modification, since the SC1 solution is supplied also to the rear surface Wb of the substrate W from the liquid discharging nozzle 27, even when the contaminants adhere to the rear surface Wf of the substrate W, it is possible to efficiently remove the contaminants from the rear surface Wb of the substrate W by means of the chemical cleaning effect of the SC1 solution. Further, in this modification, after cleaning with the SC1 solution, the DIW is supplied to the top surface Wf and the rear surface Wb of the substrate W and rinsing with the DIW is performed.

Meanwhile, in this modification, the cleaning with the SC1 solution as chemical cleaning which principally exerts a chemical cleaning effect upon a top surface Wf of the substrate W is executed. However, the chemical cleaning is not limited to the cleaning with the SC1 solution. For example, the chemical cleaning may be wet cleaning which uses, as a processing liquid, an alkaline solution, an acidic solution, an organic solvent, a surface active surfactant or the like other than the SC1 solution or wet cleaning which uses a proper combination of these as a processing liquid.

In the first embodiment described earlier, the rinsing liquid discharging nozzle 97 discharges the DIW which is at room temperature by stopping the operation of the temperature adjuster 623 to remove the frozen films $13f$ and $14f$ on the top surface Wf of the substrate W at Step S7. However, a supply mechanism for supplying the DIW at room temperature to the substrate may be disposed separately. For example, a similar supply mechanism to the chemical solution supplier 61 and the chemical solution discharge nozzle 6 may discharge the DIW at room temperature to remove the frozen films $13f$ and $14f$.

Figure 16:
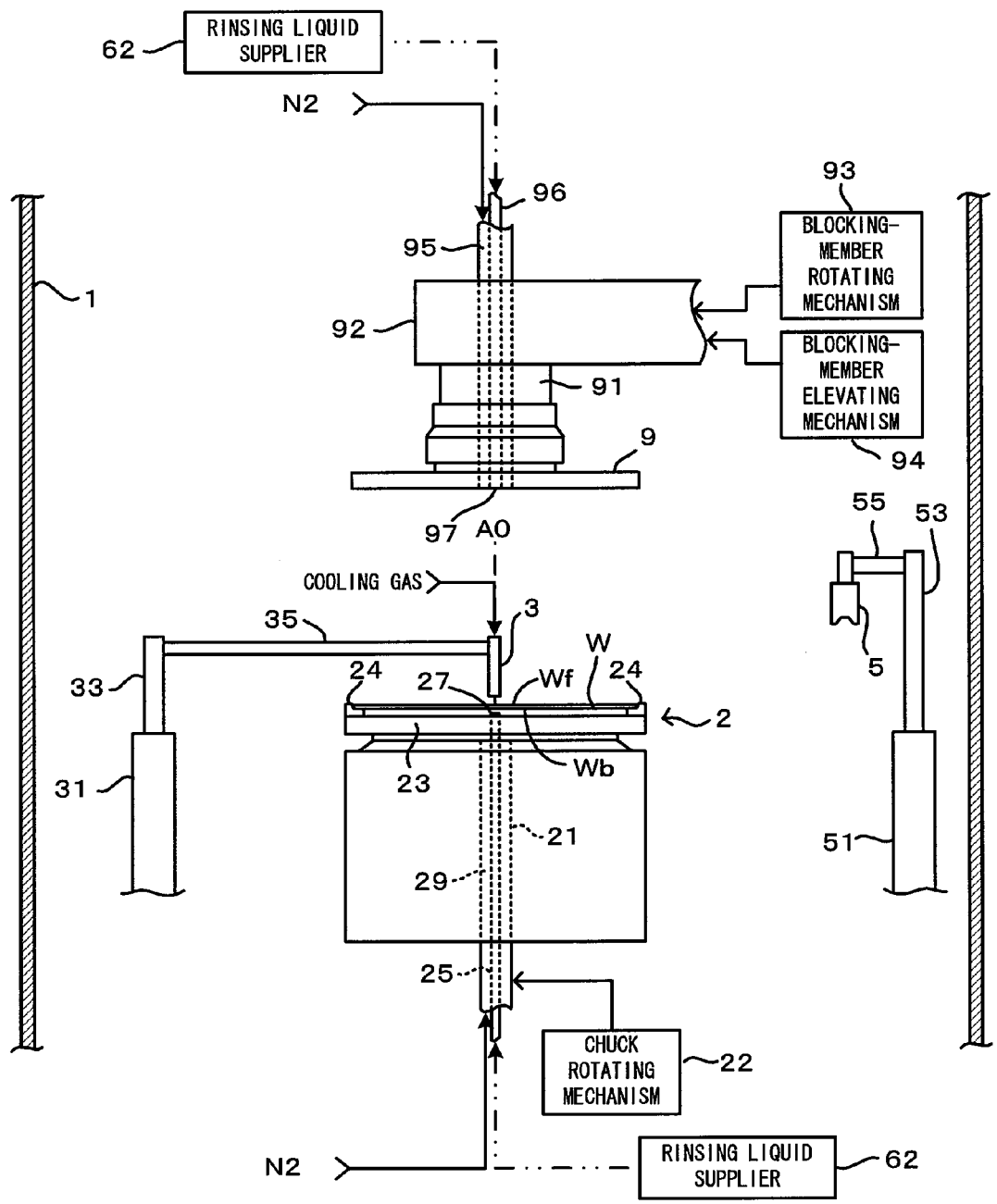
FIG. 16 is a diagram showing a modification in which a structure for physical cleaning is added to the apparatus of the first embodiment.
Figure 17:
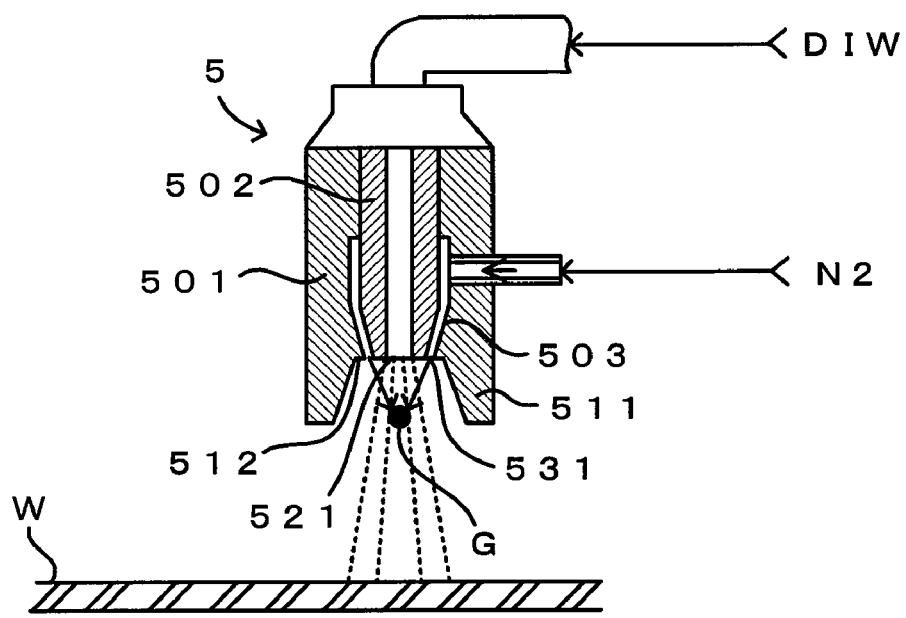
FIG. 17 is a diagram showing a structure of a two-fluid nozzle.

Furthermore, the frozen films $13f$ and $14f$ formed on the top surface Wf of the substrate W in a layered structure are removed by the DIW in the above first and second embodiments. However, whole of the multiply-layered frozen film may be removed through physical cleaning instead. FIG. 16 is a diagram showing a modification in which a structure for physical cleaning is added to the apparatus of the first embodiment. FIG. 17 is a diagram showing a structure of a two-fluid nozzle.

A motor 51 is disposed at a place outward from the spin chuck 2 in a circumferential direction. A rotary shaft 53 is connected to the motor 51, an arm 55 extending horizontally is connected to the rotary shaft 53, and a two-fluid nozzle 5 is attached to the end of the arm 55. When the motor 51 is driven in accordance with an operation command from the control unit 4, the two-fluid nozzle 5 swings around the rotary shaft 53.

This two-fluid nozzle 5 is a two-fluid nozzle of the so-called external mixing type which collides a processing liquid and a nitrogen gas (N2) in air (outside the nozzle) and generates droplets of the processing liquid. In this modification, DIW supplied from the rinsing liquid supplier 62 is used as the processing liquid, and the nitrogen gas supplied from the drying gas supplier 65 is used for instance. The two-fluid nozzle 5 includes a hollow body section 501. A processing liquid discharge nozzle 502, which has a processing liquid discharging outlet 521, is inserted inside the body section 501. The processing liquid discharging outlet 521 is disposed at a top surface part 512 of an umbrella part 511 of the two-fluid nozzle 5. Hence, supplied to the processing liquid discharge nozzle 502, the processing liquid is discharged toward the substrate W from the processing liquid discharging outlet 521.

Further, a gas discharge nozzle 503 is disposed in the vicinity of the processing liquid discharge nozzle 502, defining a ring-shaped gas channel which surrounds the processing liquid discharge nozzle 502. The tip end of the gas discharge nozzle 503 is tapered progressively thin, and the opening of this nozzle is opposed against the substrate surface W. Hence, supplied to the gas discharge nozzle 503, the nitrogen gas is discharged toward the substrate W from the gas discharging outlet 531 of the gas discharge nozzle 503.

The track of thus discharged nitrogen gas intersects that of the DIW discharged from the processing liquid discharging outlet 521. That is, the liquid flow from the processing liquid discharging outlet 521 collides with the gas flow at a collision section G which is located within a mixing region. The gas flow is discharged so as to converge at the collision section G. The mixing region is a space at the bottom end of the body section 501. Hence, the nitrogen gas colliding the DIW quickly changes the DIW into droplets, immediately near the discharging direction in which the DIW is discharged from the processing liquid discharging outlet 521. Cleaning droplets are generated in this manner.

Then, in this modification, after the frozen film is formed in a layered structure, the control unit 4, with the blocking member 9 located at the separated position, makes the two-fluid nozzle 5 supply DIW droplets to the top surface Wf of the substrate W while making the two-fluid nozzle 5 pivot over the substrate W. This collides droplets with particles adhering to the top surface Wf of the substrate W, and due to the kinetic energy of the droplets, the particles are physically removed. This makes it easy to remove particles off from the top surface Wf of the substrate W and realizes excellent cleaning of the top surface Wf of the substrate W.

Meanwhile, in this modification, the cleaning with droplets using the two-fluid nozzle as physical cleaning which principally exerts a physical effect upon the surface Wf of the substrate W is executed. However, the physical cleaning is not limited to the droplets cleaning. The physical cleaning may for example be scrub cleaning which cleans the substrate W with a brush, a sponge or the like brought into contact with the surface Wf of the substrate W, ultrasonic cleaning which cleans the substrate W by vibrating and separating particles adhering to the surface Wf of the substrate W utilizing ultrasonic vibrations or by means of an action upon the surface Wf of the substrate W by cavitations, air bubbles or the like formed in a processing liquid, etc. Further alternatively, whole of the multiply-layered frozen films may be removed off from the top surface Wf of the substrate W through cleaning of the top surface Wf of the substrate W which combines depending upon necessity physical cleaning and chemical cleaning.

Further, in this modification, in executing a droplet discharge from the two-fluid nozzle, the two-fluid nozzle of the so-called external mixing type is used, but this is not limiting. A two-fluid nozzle of the so-called internal mixing type may be used. That is, a processing liquid may be mixed with gas inside the two-fluid nozzle to generate droplets, and the droplets may be discharged toward the substrate W at a discharging outlet of the nozzle.

Figure 18:
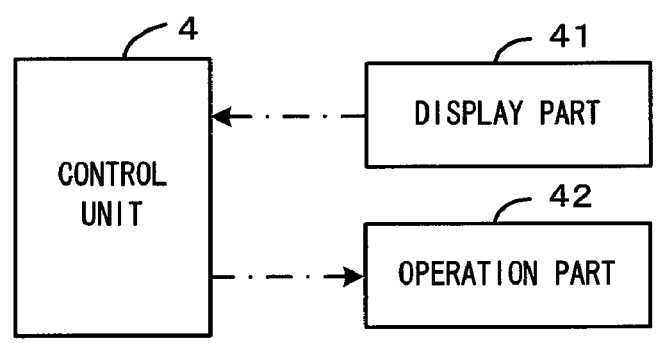
FIG. 18 is a block diagram showing a control construction of another modification of a substrate processing apparatus.

Further, the number of the layers in the upper layer frozen film has the predetermined value in the first embodiment described earlier. In the second embodiment described earlier, whether the discharge of the DIW of minute droplets has finished or not is determined in accordance with whether the predetermined time has elapsed for example. These are controlled based on a stored count or time within a memory incorporated inside the control unit 4 for example. These count and time may be made changeable in the invention. For instance, in the structure shown in FIG. 18, as a modification of the first embodiment described earlier, a display part 41 may show a message which requests for selection or entry of the number of the layers in the upper layer frozen film, and the upper layer frozen film may be formed in a layered structure with the number of layers a user has operated an operation part 42 to select or enter. Alternatively, as a modification of the second embodiment described earlier, the display part 41 may show a message which requests for selection or entry of minute droplets of the DIW discharging time, and the discharge of minute droplets of the DIW may be performed during the discharging time a user has operated the operation part 42 to select or enter, to thereby form the upper layer frozen film which has a desired film thickness. According to the modification, it is possible to realize a favorable substrate processing apparatus which meets various substrate processing conditions such as the type of the substrate W to be processed, the type of immediately preceding processing or step executed upon the substrate W to be processed, and the recipe of substrate processing executed upon the substrate W to be processed. In the modification, the control unit 4 which incorporates the memory thus corresponds to the "storage unit" of the invention and the operation part 42 thus corresponds to the "rewriting unit" of the invention.

In other words, the modification comprises a storage unit which stores a number of times to form the upper layer frozen film in a layered structure, and a rewriting unit which rewrites the number of times stored within the storage unit in accordance with a predetermined substrate processing condition. And, in the modification, the forming of the upper layer frozen film in a layered structure is executed the number of times stored in the storage unit. According to this structure, while the upper layer frozen film is formed in a layered structure the number of times stored in the storage unit, this stored count is rewritten in accordance with predetermined substrate processing conditions. Therefore, the upper layer frozen film consisting of the number of layers which corresponds to the substrate processing conditions is formed in a layered structure. At this stage, the substrate processing conditions may be, for instance, the type of the substrate to be processed, the type of immediately preceding processing or step executed upon the substrate to be processed, the recipe of substrate processing executed upon the substrate to be processed, and the like.

Further, in the embodiments above, although DIW is used as a rinsing liquid which forms a liquid film, the rinsing liquid is not limited to DIW. For instance, purified water, carbonated water, a hydrogen-saturated water, and the like may be used as a rinsing liquid which forms a liquid film.

Further, although the embodiments above have described an example of applying the substrate processing apparatus which has a function to freeze a liquid film formed on the surface Wf of the substrate W according to the invention to cleaning processing to remove contaminants, such as particles, adhering to the surface Wf of the substrate W, the invention is not limited only to such an application. For instance, a liquid film frozen by using the substrate processing apparatus and method according to the invention is used as a protection film to protect the substrate surface. That is, a liquid film is formed on the top surface Wf of the substrate W, and the liquid film is frozen so that the frozen film function as a protection film of the top surface Wf of the substrate W, thereby protecting the top surface Wf of the substrate W against contamination from the ambient atmosphere around the substrate W. This allows the substrate W to be stored or remain on standby while preventing contamination of the top surface Wf of the substrate W by the frozen film acting as a protection film.

The present invention is applicable to a substrate processing apparatus and a substrate processing method which freeze a liquid film formed on a surface of substrates in general including semiconductor wafers, glass substrates for photomask, glass substrates for liquid crystal display, glass substrates for plasma display, substrates for FED (field emission display), substrates for optical disks, substrates for magnetic disks, and substrates for magnet-optical disks.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus, comprising:
   a liquid supplier which supplies a liquid toward a surface of a substrate;
   a freezing unit which freezes a liquid film which is formed on the substrate surface by the supply of the liquid performed by the liquid supplier to form a lower layer frozen film;
   a lower layer film thickness adjuster which includes a rotating mechanism rotating the substrate, and adjusts, by rotating the substrate by means of the rotating mechanism, a thickness of the liquid film which is formed on the substrate surface by the supply of the liquid performed by the liquid supplier to a predetermined value;
   a storage unit which stores a number which is representative of a number of layers to be formed in an upper layer frozen film, which is to be formed in a layered structure on top of the lower layer frozen film;
   the lower layer frozen film being formed by the freezing of the liquid film, whose thickness is adjusted by the lower layer film thickness adjuster, performed by the freezing unit;
   the upper layer frozen film being formed by a supply of the liquid, performed by the liquid supplier, toward a surface of the lower layer frozen film and freezing of the supplied liquid performed by the freezing unit;
   a controller which is connected to said storage unit to receive said number from the storage unit and is configured to control the liquid supplier and the freezing unit to form the upper layer frozen film in a layered structure according to said number of layers stored in the storage unit; and
   a remover which removes all of the frozen films formed on the substrate surface, after the upper layer frozen film with said stored number of layers has been formed in a layered structure on top of the lower layer frozen film, wherein
   the liquid supplier includes a temperature adjuster which cools down the liquid to a temperature at which the supply of the liquid toward the surface of the lower layer frozen film performed by the liquid supplier does not melt the lower layer frozen film.

2. The substrate processing apparatus of claim 1, further comprising:
   a rewriting unit which is configured for rewriting said number representative of the number of layers to be formed, within the storage unit, in accordance with a predetermined substrate processing condition.

3. The substrate processing apparatus of claim 1, wherein the freezing unit includes:
   a cooling gas discharger which discharges a cooling gas whose temperature is lower than the freezing point of the liquid toward a local section of the substrate surface; and
   a relative moving mechanism which relatively moves the cooling gas discharger relative to the substrate and parallel to the substrate surface, and wherein
   the relative moving mechanism relatively moves the cooling gas discharger relative to the substrate while the cooling gas discharger discharges the cooling gas, whereby the respective frozen films are formed.

4. The substrate processing apparatus of claim 3, wherein the liquid supplier includes a liquid supply pipe which supplies the liquid and a liquid discharge nozzle which discharges the liquid inside the liquid supply pipe toward the substrate,
   the freezing unit further includes a gas supply pipe which guides the cooling gas to the cooling gas discharger, and
   at least a part of the liquid supply pipe and at least a part of the gas supply pipe are disposed side by side in the vicinity of each other.

5. The substrate processing apparatus of claim 4, wherein the liquid discharge nozzle and the cooling gas discharger are interconnected for being moved together as one unit, and
   the relative moving mechanism relatively moves the liquid discharge nozzle and the cooling gas discharger, which are interconnected for being moved together as one unit, relative to the substrate.

6. The substrate processing apparatus of claim 1, wherein the liquid is purified water or deionized water, and the temperature adjuster cools the liquid down to 0 through 2 degrees centigrade.

7. The substrate processing apparatus of claim 1, comprising a droplet supplier which discharges droplets of the liquid and accordingly supplies the liquid toward the surface of the lower layer frozen film.

8. The substrate processing apparatus of claim 7, wherein the freezing of the liquid is executed while the droplet supplier discharges droplets of the liquid toward the surface of the lower layer frozen film.

9. The substrate processing apparatus of claim 1, wherein the controller controls the lower layer film thickness adjuster to set the thickness of the lower layer liquid film to said predetermined value.

* * * * *